United States Patent
Seo et al.

(10) Patent No.: US 11,256,285 B2
(45) Date of Patent: Feb. 22, 2022

(54) CLOCK GENERATION CIRCUIT AND SEMICONDUCTOR APPARATUS USING THE CLOCK GENERATION CIRCUIT

(71) Applicant: SK hynix Inc., Icheon-si Gyeonggi-do (KR)

(72) Inventors: Young Suk Seo, Icheon-si Gyeonggi-do (KR); Gyu Tae Park, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 17/184,282

(22) Filed: Feb. 24, 2021

(65) Prior Publication Data

US 2021/0271288 A1    Sep. 2, 2021

(30) Foreign Application Priority Data

Feb. 27, 2020    (KR) .................. 10-2020-0024488

(51) Int. Cl.
*H03L 7/07* (2006.01)
*G06F 1/10* (2006.01)
*H03K 5/135* (2006.01)

(52) U.S. Cl.
CPC .............. *G06F 1/10* (2013.01); *H03K 5/135* (2013.01); *H03L 7/07* (2013.01)

(58) Field of Classification Search
None
See application file for complete search history.

(56) References Cited

U.S. PATENT DOCUMENTS

| 10,069,662 B2 | 9/2018 | Papananos et al. |
| 2014/0015575 A1* | 1/2014 | Jung .................. H03L 7/0816 327/156 |
| 2019/0147927 A1 | 5/2019 | Jeon et al. |

(Continued)

FOREIGN PATENT DOCUMENTS

KR    100780959 B1    12/2007

OTHER PUBLICATIONS

Immanuel Raja et al., A 0.1-3.5-GHz Duty-Cycle Measurement and Correction Technique in 130-nm CMOS, IEEE Transactions on Very Large Scale Integration (VLSI) Systems, vol. 24, No. 5, May 2016, pp. 1975-1983.

(Continued)

*Primary Examiner* — Cassandra F Cox
(74) *Attorney, Agent, or Firm* — William Park & Associates Ltd.

(57) ABSTRACT

A clock generation circuit may include a clock receiver, a first delay loop circuit, and a second delay loop circuit. The clock receiver may receive a first clock signal and a second clock signal and generate a first reception clock signal and a second reception clock signal. The first delay loop circuit may receive the first reception clock signal and the second reception clock signal generate a reference clock signal. The first delay loop circuit may perform a delay-locking operation on the reference clock signal to generate a first delay locked clock signal. The second delay loop circuit may delay the first reception clock signal and the second reception clock signal based on the first delay locked clock signal and an internal clock signal to generate a first internal clock signal.

31 Claims, 17 Drawing Sheets

(56) References Cited

U.S. PATENT DOCUMENTS

2019/0214998 A1* 7/2019 Soga ................. H04L 7/033
2019/0296752 A1   9/2019 Satoh

OTHER PUBLICATIONS

In-Young Chung et al., Design Techniques of Delay-Locked Loop for Jitter Minimization in DRAM Applications, IEICE Trans. Electron., vol. E88-C, No. 4, Apr. 2005, pp. 753-759.
Kyomin Sohn et al., A 1.2 V 30 nm 3.2 Gb/s/pin 4 Gb DDR4 SDRAM With Dual-Error Detection and PVT-Tolerant Data-Fetch Scheme, IEEE Journal of Solid-State Circuits, vol. 48, No. 1, Jan. 2013, pp. 168-177.
Yang Ki Kim et al., A 1.5V, 1.6Gb/s/pin, 1 GB DDR3 SDRAM with an Address Queuing Scheme and Bang-Bang Jitter Reduced DLL Scheme, 2007 Symposium on V/LSI Circuits Digest of Technical Papers, pp. 182-183, DRAM Design, Memory Division, Samsung Electonics Company, Hwasung, Korea.

\* cited by examiner

FIG.6
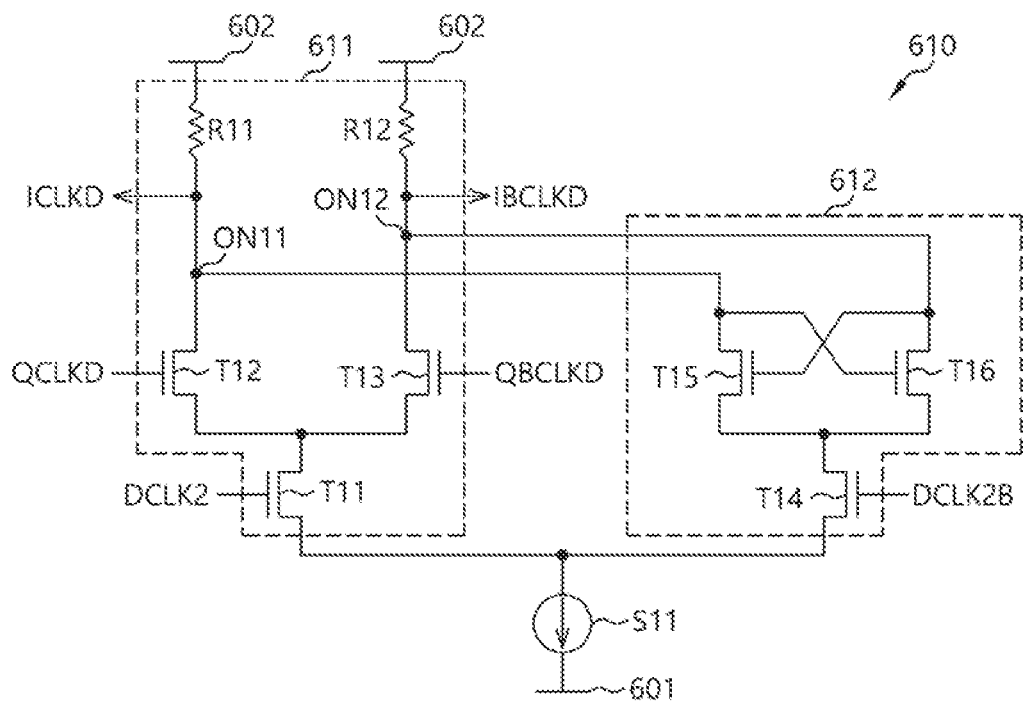
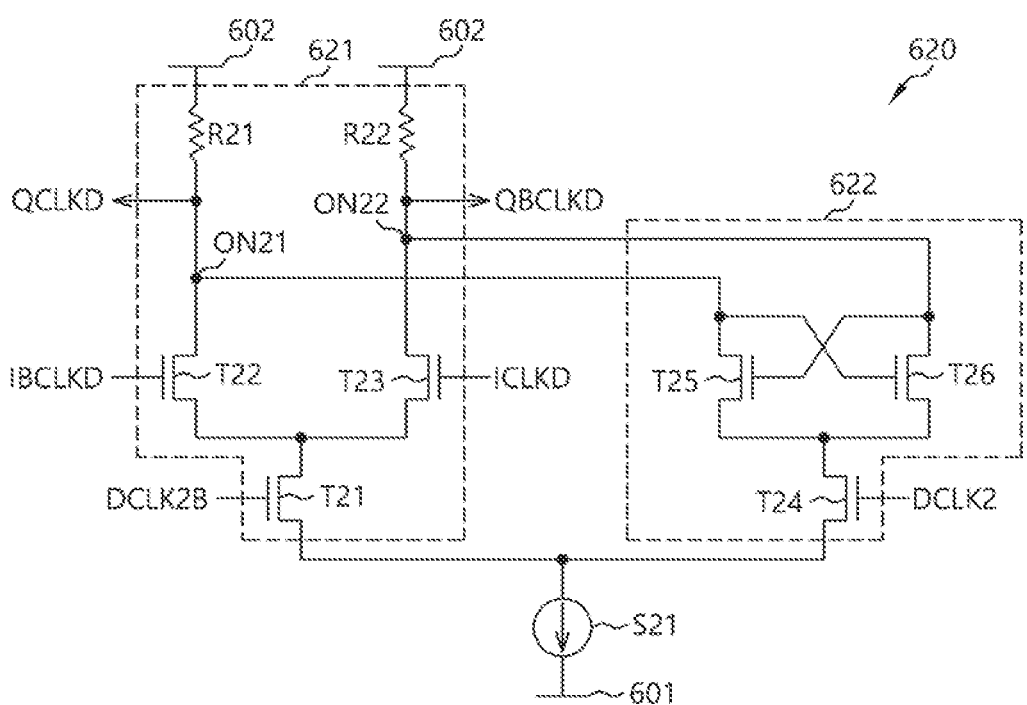

FIG.14
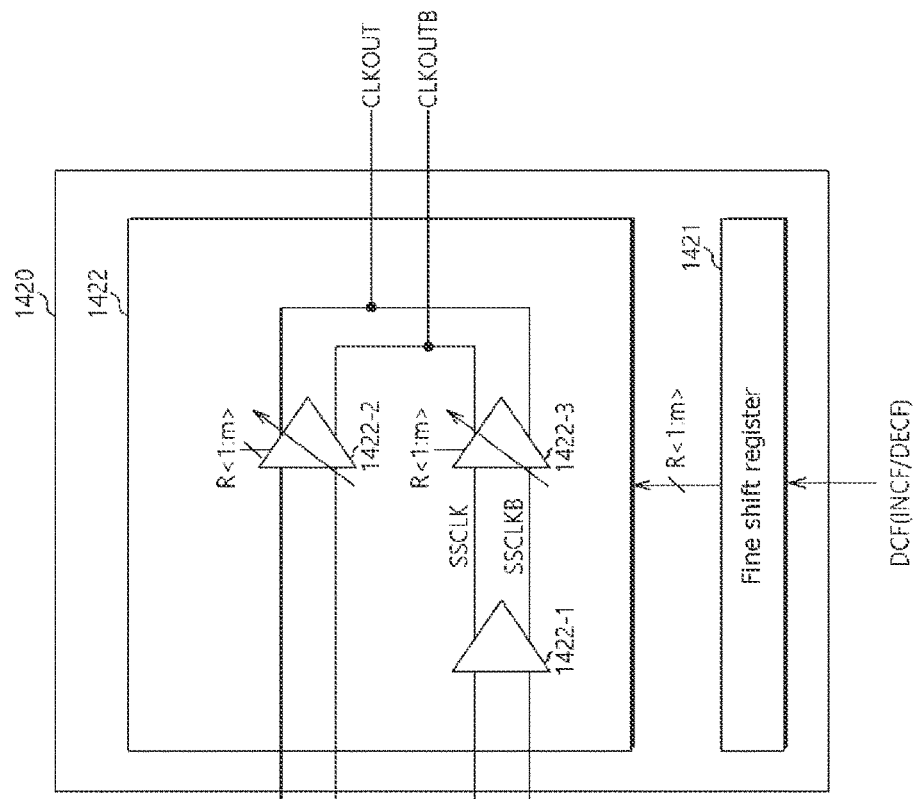
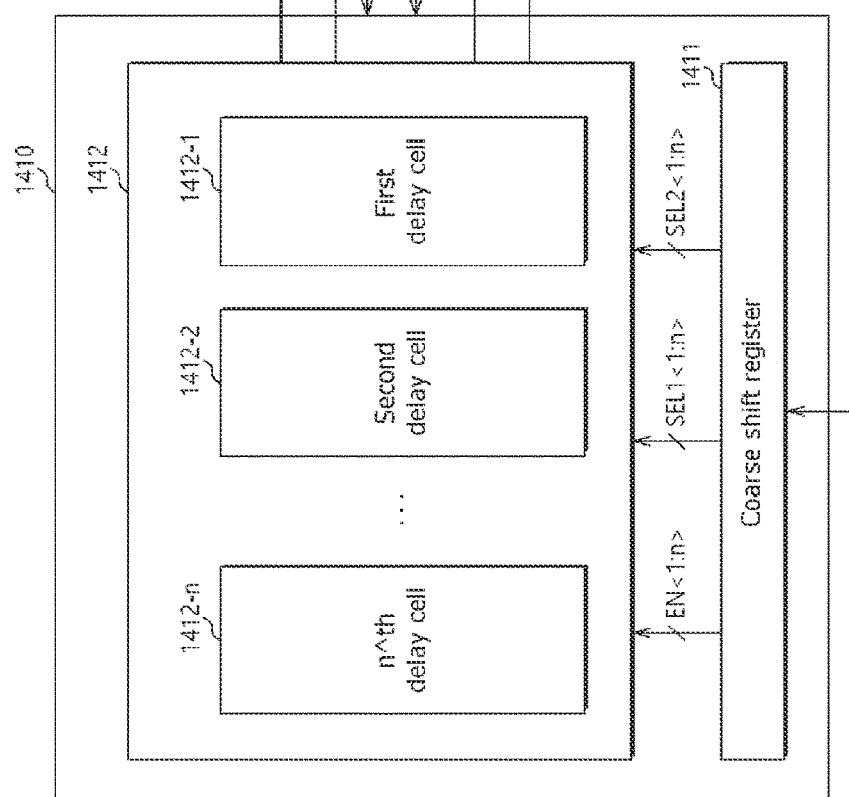

CLOCK GENERATION CIRCUIT AND SEMICONDUCTOR APPARATUS USING THE CLOCK GENERATION CIRCUIT

CROSS-REFERENCES TO RELATED APPLICATION

The present application claims priority under 35 U.S.C. § 119(a) to Korean application number 10-2020-0024488, filed on Feb. 27, 2020, in the Korean Intellectual Property Office, which is incorporated herein by reference in its entirety.

BACKGROUND

1. Technical Field

Various embodiments generally relate to an integrated circuit technology, and more particularly, to a clock generation circuit and a semiconductor device using the clock generation circuit.

2. Related Art

An electronic device includes many electronic elements. A computer system of the electronic elements may include lots of semiconductor devices configured with semiconductors. The semiconductor devices configuring the computer system may communicate with each other by transmitting and receiving clock signals and data. The semiconductor devices may operate in synchronization with a clock signal. The semiconductor devices may output or receive data in synchronization with a clock signal. Accordingly, in order for smooth data communication to be performed between the semiconductor devices, a clock signal having an accurate phase and small skew needs to be generated. The semiconductor devices are equipped with various clock generation circuits in order to generate a multi-phase clock signal from the clock signal. For example, the clock generation circuit may include a phase-locked loop circuit, a delay-locked loop circuit, etc. The delay-locked loop circuit may include a digital delay-locked loop circuit controlled according to a digital method and an analog delay-locked loop circuit controlled according to an analog method. In order to generate a multi-phase clock signal having a constant phase difference between the phase-locked loop circuit and the delay-locked loop circuit regardless of a voltage and/or a process change, a phase-locked loop circuit or delay-locked loop circuit having high performance may be used. However, the use of a clock generation circuit having high performance may inevitably require a lot of power, which may not accord with a technical trend for low power of a semiconductor device.

SUMMARY

In an embodiment, a clock generation circuit may include a clock receiver, a first delay loop circuit, and a second delay loop circuit. The clock receiver may be configured to receive a first clock signal and a second clock signal to generate a first reception clock signal and a second reception clock signal. The first delay loop circuit may be configured to receive the first reception clock signal and the second reception clock signal to generate a reference clock signal. The first delay loop circuit may be configured to perform a delay-locking operation on the reference clock signal to generate a first delay locked clock signal. The second delay loop circuit may be configured to delay the first reception clock signal and the second reception clock signal based on the first delay locked clock signal and an internal clock signal to generate a first internal clock signal.

In an embodiment, a clock generation circuit may include a clock receiver, a first delay loop circuit, and a second delay loop circuit. The clock receiver may be configured to receive a first clock signal and a second clock signal to generate a first reception clock signal and a second reception clock signal. The first delay loop circuit may be configured to receive the first and second reception clock signals to generate a first reference clock signal. The first delay loop circuit may be configured to delay the first reference clock signal based on the first delay locked clock signal and a first internal clock signal to generate a first delay locked clock signal. The second delay loop circuit may be configured to perform delay-locking operations on the first and second reception clock signals to generate the first internal clock signal.

In an embodiment, a semiconductor device may include a clock receiver, a first delay loop circuit, a second delay loop circuit, a command decoder, a command delay line, a latency shifting circuit, and a gating circuit. The clock receiver may be configured to receive a first clock signal and a second clock signal to generate a first reception clock signal and a second reception clock signal. The first delay loop circuit may include a single-ended CMOS clock delay line. The first delay loop circuit may be configured to delay a reference clock signal which is generated from the first and second reception clock signals based on the reference clock signal and the first delay locked clock signal to generate a first delay locked clock signal. The second delay loop circuit may include a differential current mode logic (CML) clock delay line. The second delay loop circuit may be configured to delay the first and second reception clock signals based on the first delay locked clock signal and the first internal clock signal to generate a first internal clock signal. The command decoder may be configured to decode a command signal to generate an internal command signal. The command delay line may be configured to delay the internal command signal with as much time as what is substantially identical with a time duration needed for the reference clock signal to be delayed through the single-ended CMOS clock delay line to generate a delay command signal. The latency shifting circuit may be configured to delay the delay command signal with as much time as what corresponds to a latency based on the first delay locked clock signal to generate a synchronization command signal. The gating circuit may be configured to synchronize the synchronization command signal with the first internal clock signal to generate an output control signal.

In an embodiment, a semiconductor device may include a clock receiver, a first delay loop circuit, a second delay loop circuit, a command decoder, a command delay line, a latency shifting circuit, and a gating circuit. The clock receiver may be configured to receive a first clock signal and a second clock signal to generate a first reception clock signal and a second reception clock signal. The first delay loop circuit may include a single-ended CMOS clock delay line. The first delay loop circuit may be configured to delay a first reference clock signal which is generated from the first and second reception clock signals based on the first reference clock signal and a first internal clock signal to generate a first delay locked clock signal. The second delay loop circuit may include a differential current mode logic (CML) clock delay line. The second delay loop circuit may be configured to delay the first and second reception clock signals based on the first internal clock signal and a second reference clock signal which is generated from the first and second reception clock signals to generate the first internal clock signal. The command decoder may be configured to decode a command signal to generate an internal command signal. The command delay line may be configured to delay the internal command signal for as much as a time duration that is substantially identical to a time duration needed for the first reference clock signal to be delayed through the single-ended CMOS clock delay line to generate a delay command signal. The latency shifting circuit may be configured to delay the delay command signal with as much time as what corresponds to a latency based on the first delay locked clock signal to generate a synchronization command signal. The gating circuit may be configured to synchronize the synchronization command signal with the first internal clock signal to generate an output control signal.

BRIEF DESCRIPTION OF THE DRAWINGS

FIG. 6 is a diagram illustrating a configuration of a CML clock divider illustrated in FIG. 5.

FIG. 14 is a diagram illustrating a configuration of a delay line according to an embodiment.

DETAILED DESCRIPTION

Hereinafter, embodiments are described with reference to the accompanying drawings.

Figure 1:
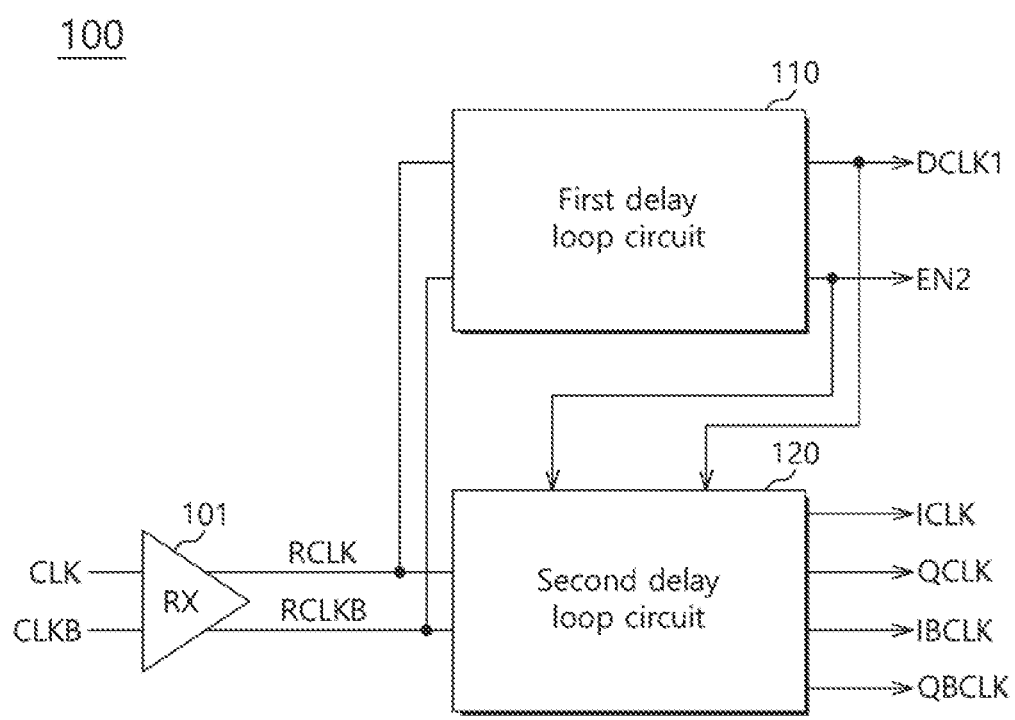
FIG. 1 is a diagram illustrating a configuration of a clock generation circuit according to an embodiment.

FIG. 1 is a diagram illustrating a configuration of a clock generation circuit 100 according to an embodiment. Referring to FIG. 1, the clock generation circuit 100 may generate a plurality of output clock signals by receiving clock signals CLK and CLKB. The clock generation circuit 100 may include at least two delay loop circuits. The at least two delay loop circuits may have different characteristics. The at least two delay loop circuits may generate output signals having different characteristics by delaying received clock signals, respectively. One delay loop circuit may consume less power than the other delay loop circuit in order to delay the clock signal. The other delay loop circuit may consume more power than the one delay loop circuit in order to delay the clock signal. However, the other delay loop circuit may generate an output clock signal having higher performance than that of the one delay loop circuit and having an accurate phase and accurate duty ratio. Furthermore, the other delay loop circuit can minimize a phase skew among a plurality of output clock signals. The one delay loop circuit may include a single-ended CMOS clock delay line. The other delay loop circuit may include a differential current mode logic (CML) clock delay line. Accordingly, the other delay loop circuit may consume more power than the one delay loop circuit, but perform a precise delay operation.

The clock generation circuit 100 may include a clock receiver (RX) 101, a first delay loop circuit 110 and a second delay loop circuit 120. The clock receiver 101 may receive a first clock signal CLK and a second clock signal CLKB. The clock receiver 101 may generate a first reception clock signal RCLK and a second reception clock signal RCLKB by differentially amplifying the first clock signal CLK and the second clock signal CLKB. The second clock signal CLKB may be a complementary signal having a phase opposite the phase of the first clock signal CLK. The first and second clock signals CLK and CLKB may be system clock signals transmitted by an external device of a semiconductor device including the clock generation circuit 100. In an embodiment, the first and second clock signals CLK and CLKB may be clock signals generated through a ring oscillator, a phase-locked loop circuit, etc. The second reception clock signal RCLKB may be a complementary signal having a phase opposite the phase of the first reception clock signal RCLK. The first reception clock signal RCLK may have a phase corresponding to that of the first clock signal CLK. The second reception clock signal RCLKB may have a phase corresponding to that of the second clock signal CLKB.

The first delay loop circuit 110 may receive the first and second reception clock signals RCLK and RCLKB. The first delay loop circuit 110 may generate a first delay locked clock signal DCLK1 by delaying the first and second reception clock signals RCLK and RCLKB. The first delay loop circuit 110 may generate a reference clock signal from the first and second reception clock signals RCLK and RCLKB, and may generate the first delay locked clock signal DCLK1 by performing a delay-locking operation on the reference clock signal. The first delay loop circuit 110 may include a clock delay line that consumes a relatively smaller amount of power and requires relatively less performance than that of the second delay loop circuit 120 in order to delay the first and second reception clock signals RCLK and RCLKB and/or the reference clock signal. The first delay loop circuit 110 may include a single-ended CMOS clock delay line. The reference clock signal may be generated as a single-ended signal. The single-ended CMOS clock delay line may include a plurality of CMOS delay cells that sequentially delays the single-ended signal. The first delay loop circuit 110 may control whether to activate the second delay loop circuit 120 based on an operation mode and the delay-locking operation. The first delay loop circuit 110 may deactivate the second delay loop circuit 120 in a specific condition in order to minimize power consumption of the clock generation circuit 100. The first delay loop circuit 110 may generate an enable signal EN2 based on the operation mode and the delay-locking operation. For example, when a phase of the first delay locked clock signal varies within a given range in a power-down mode and/or a low power mode, the first delay loop circuit 110 may deactivate the second delay loop circuit 120 by maintaining the state of the enable signal EN2 to a disable state. When a phase of the first delay locked clock signal varies out of the given range, the first delay loop circuit 110 may activate the second delay loop circuit 120 by enabling the enable signal EN2. The given range may be defined by a threshold value related to the number of updates of the first delay loop circuit 110. When an update for increasing the amount of delay of the first delay loop circuit 110 continuously occurs by the threshold value or more or an update for decreasing the amount of delay of the first delay loop circuit 110 continuously occurs by the threshold value or more, the first delay loop circuit 110 may activate the second delay loop circuit 120 by enabling the enable signal EN2. When an update for increasing the amount of delay of the first delay loop circuit 110 and an update for decreasing the amount of delay of the first delay loop circuit 110 alternately occur or any one of the updates does not continuously occur by the number of times corresponding to the threshold value, the first delay loop circuit 110 may maintain the state of the enable signal EN2 to a disable state and deactivate the second delay loop circuit 120.

The second delay loop circuit 120 may generate at least one internal clock signal by delaying the first and second reception clock signals RCLK and RCLKB. The second delay loop circuit 120 may generate a first internal clock signal ICLK by delaying the first and second reception clock signals RCLK and RCLKB. The second delay loop circuit 120 may generate the first internal clock signal ICLK by delaying the first and second reception clock signals RCLK and RCLKB based on the first delay locked clock signal DCLK1, generated by the first delay loop circuit 110, and the first internal clock signal ICLK. The second delay loop circuit 120 may generate the first internal clock signal ICLK having substantially the same phase as the first delay locked clock signal DCLK1 by comparing the phases of the first delay locked clock signal DCLK1 and first internal clock signal ICLK. The second delay loop circuit 120 may further generate a second internal clock signal QCLK, a third internal clock signal IBCLK and a fourth internal clock signal QBCLK by delaying the first and second reception clock signals RCLK and RCLKB. The first to fourth internal clock signals ICLK, QCLK, IBCLK, and QBCLK may sequentially have the same phase differences. The second internal clock signal QCLK may have a phase 90° later than the phase of the first internal clock signal ICLK. The third internal clock signal IBCLK may have a phase 90° later than the phase of the second internal clock signal QCLK. The fourth internal clock signal QBCLK may have a phase 90° later than the phase of the third internal clock signal IBCLK. The first internal clock signal ICLK may have a phase 90° later than the phase of the fourth internal clock signal QBCLK. The second delay loop circuit 120 may be selectively activated by the first delay loop circuit 110. The second delay loop circuit 120 may receive the enable signal EN2 generated by the first delay loop circuit 110. When the enable signal EN2 is enabled, the second delay loop circuit 120 may be activated to generate the first internal clock signal ICLK. When the enable signal EN2 is disabled, the second delay loop circuit 120 may be deactivated and might not generate the first internal clock signal ICLK.

Figure 2:
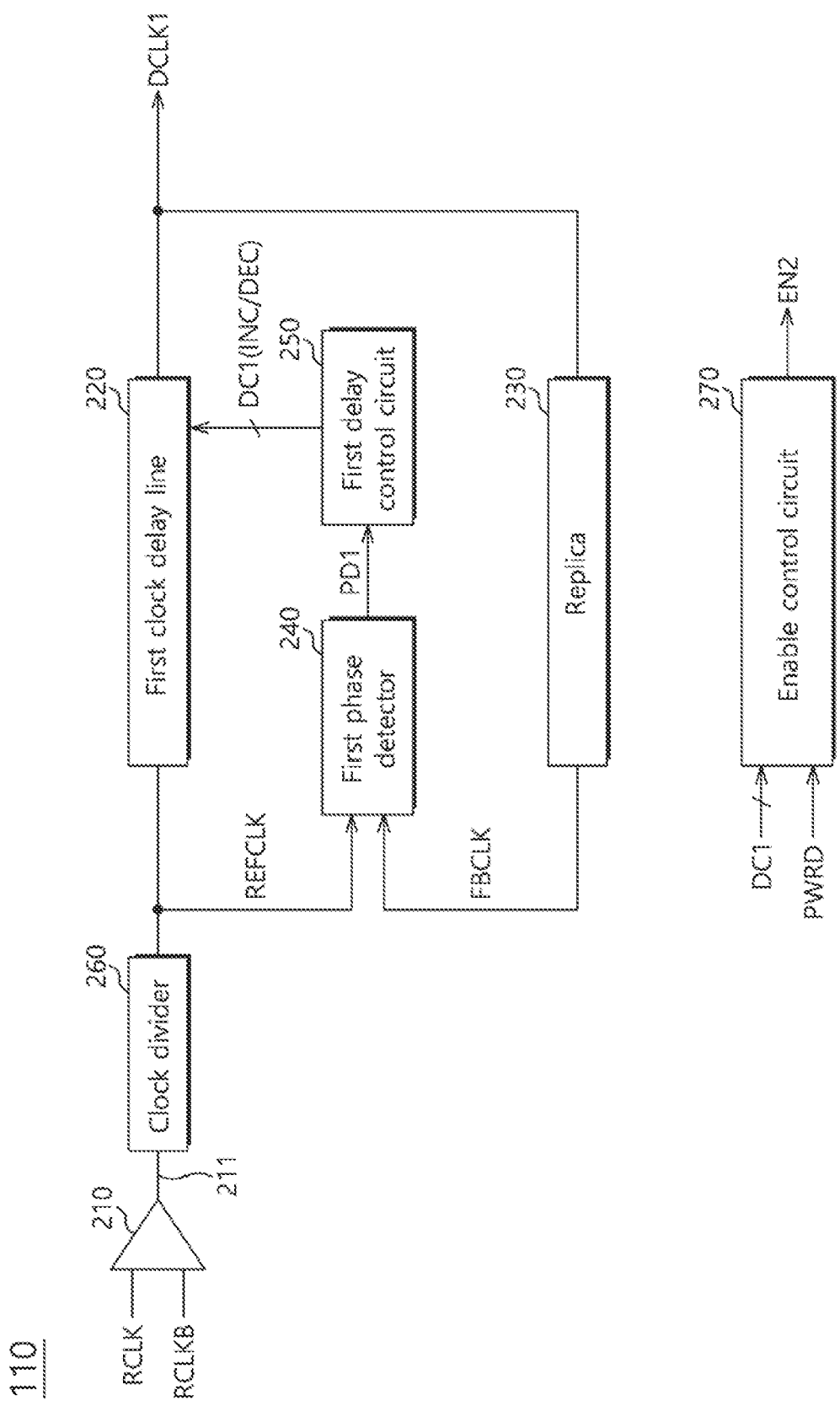
FIG. 2 is a diagram illustrating a configuration of a first delay loop circuit illustrated in FIG. 1.

FIG. 2 is a diagram illustrating a configuration of the first delay loop circuit 110 illustrated in FIG. 1. Referring to FIG. 2, the first delay loop circuit 110 may include a first clock buffer 210, a first clock delay line 220, a replica 230, a first phase detector 240 and a first delay control circuit 250. The first clock buffer 210 may receive the first and second reception clock signals RCLK and RCLKB. The first clock buffer 210 may buffer the first and second reception clock signals RCLK and RCLKB, and may provide a buffered clock signal 211 as a reference clock signal REFCLK. The first clock delay line 220 may receive the reference clock signal REFCLK, and may generate the first delay locked clock signal DCLK1 by delaying the reference clock signal REFCLK. The first clock delay line 220 may delay the reference clock signal REFCLK based on a first delay control signal DC1. The amount of delay of the first clock delay line 220 may be changed based on the first delay control signal DC1. The first clock delay line 220 may be a single-ended CMOS delay line and may include a plurality of CMOS delay cells. In an embodiment, the first clock delay line 220 may further include a shift register circuit for changing the number of CMOS delay cells activated based on the first delay control signal DC1.

The replica 230 may receive the first delay locked clock signal DCLK1, and may generate a feedback clock signal FBCLK by delaying the first delay locked clock signal DCLK1 by a modeled delay time. The replica 230 may be designed to have a given amount of delay. The replica 230 may model a clock path along which the clock signals CLK and CLKB are transmitted through the clock generation circuit 100 and/or an internal circuit of a semiconductor device including the clock generation circuit 100. The replica 230 may have the amount of delay corresponding to a delay time attributable to the clock path of the semiconductor device including the clock generation circuit 100.

The first phase detector 240 may receive the reference clock signal REFCLK and the feedback clock signal FBCLK. The first phase detector 240 may generate a first phase detection signal PD1 by comparing the phases of the reference clock signal REFCLK and feedback clock signal FBCLK. The first phase detector 240 may change a logic level of the first phase detection signal PD1 by detecting whether the phase of the reference clock signal REFCLK is earlier or later than the phase of the feedback clock signal FBCLK. For example, when the phase of the reference clock signal REFCLK is earlier than the phase of the feedback clock signal FBCLK, the first phase detector 240 may generate the first phase detection signal PD1 having a logic high level. When the phase of the reference clock signal REFCLK is later than the phase of the feedback clock signal FBCLK, the first phase detector 240 may generate the first phase detection signal PD1 having a logic low level.

The first delay control circuit 250 may receive the first phase detection signal PD1 generated by the first phase detector 240. The first delay control circuit 250 may generate the first delay control signal DC1 based on the first phase detection signal PD1. The first delay control signal DC1 may be an update signal for changing the amount of delay of the first clock delay line 220. The first delay control signal DC1 may include a phase increase signal INC and a phase decrease signal DEC. The phase increase signal INC may be a signal to increase the amount of delay of the first clock delay line 220. The phase increase signal INC may be a signal to increase the number of activated CMOS delay cells. The phase decrease signal DEC may be a signal to decrease the amount of delay of the first clock delay line 220. The phase decrease signal DEC may be a signal to decrease the number of activated CMOS delay cells. The first delay control circuit 250 may generate the phase increase signal INC and the phase decrease signal DEC based on the first phase detection signal PD1, until the phases of the reference clock signal REFCLK and feedback clock signal FBCLK become substantially the same. When the phase increase signal INC and the phase decrease signal DEC are alternately generated, the first delay control circuit 250 may determine that the phases of the reference clock signal REFCLK and feedback clock signal FBCLK have been matched, and may fix the amount of delay of the first clock delay line 220 by generating a locking signal. In an embodiment, the first delay control circuit 250 may include a filter. The filter may include one of an average filter and a moving average filter. For example, when the first phase detection signal PD1 having a logic high level is continuously generated by the number of times corresponding to a threshold value, the filter may generate the phase increase signal INC. When the first phase detection signal PD1 having a logic low level is continuously generated by the number of times corresponding to the threshold value, the filter may generate the phase decrease signal DEC. When a difference between the number of times that the first phase detection signal PD1 having a logic high level is generated and the number of times that the first phase detection signal PD1 having a logic low level is generated corresponds to a threshold value, the filter may generate one of the phase increase signal INC and the phase decrease signal DEC.

The first delay loop circuit 110 may further include a clock divider 260. The clock divider 260 may be coupled between the first clock buffer 210 and the first clock delay line 220. The clock divider 260 may divide the frequency of the buffered clock signal 211 output by the clock buffer 210, and may provide a divided clock signal as the reference clock signal REFCLK. For example, the clock divider 260 may generate the reference clock signal REFCLK having a lower frequency and longer cycle than the first and second reception clock signals RCLK and RCLKB, by dividing the buffered clock signal 211.

The first delay loop circuit 110 may further include an enable control circuit 270. The enable control circuit 270 may generate the enable signal EN2 by receiving the first delay control signal DC1 and a power-down signal PWRD. The power-down signal PWRD may be a signal indicating that the clock generation circuit 100 and/or a semiconductor device including the clock generation circuit 100 operate and/or operates in a power-down mode and/or a low power mode. When the semiconductor device operates in the power-down mode and/or the low power mode, the power-down signal PWRD may be enabled. In the state in which the power-down signal PWRD has been disabled, that is, when the semiconductor device does not operate in the power-down mode and/or the low power mode, the enable control circuit 270 may enable the enable signal EN2 regardless of the first delay control signal DC1. In the state in which the power-down signal PWRD has been enabled, the enable control circuit 270 may selectively enable the enable signal EN2 based on the first delay control signal DC1. In the state in which the power-down signal PWRD has been enabled, when a phase difference between the reference clock signal REFCLK and the feedback clock signal FBCLK is not great, the enable control circuit 270 may maintain the state of the enable signal EN2 to a disable state. The enable control circuit 270 may maintain the state of the enable signal EN2 to a disable state when the phase difference between the reference clock signal REFCLK and the feedback clock signal FBCLK is within a given range. In contrast, when a phase difference between the reference clock signal REFCLK and the feedback clock signal FBCLK increases, the enable control circuit 270 may enable the enable signal EN2. The enable control circuit 270 may enable the enable signal EN2 when the phase difference between the reference clock signal REFCLK and the feedback clock signal FBCLK is outside the given range.

Figure 3:
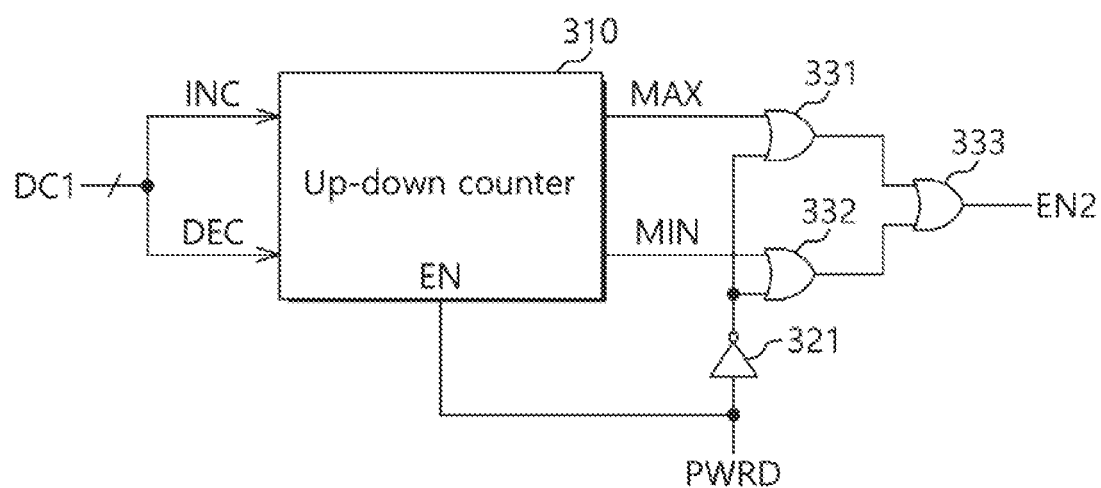
FIG. 3 is a diagram illustrating a configuration of an enable control circuit illustrated in FIG. 2.

FIG. 3 is a diagram illustrating a configuration of the enable control circuit 270 illustrated in FIG. 2. Referring to FIG. 3, the enable control circuit 270 may include an up-down counter 310, an inverter 321, a first OR gate 331, a second OR gate 332 and a third OR gate 333. The up-down counter 310 may receive the first delay control signal DC1 and count the first delay control signal DC1. The up-down counter 310 may generate a maximum signal MAX and a minimum signal MIN by counting the first delay control signal DC1. The up-down counter 310 may generate the maximum signal MAX and the minimum signal MIN by counting the phase increase signal INC and the phase decrease signal DEC, respectively. When one of the phase increase signal INC and the phase decrease signal DEC is continuously counted by the number of times corresponding to a threshold value, the up-down counter 310 may generate the maximum signal MAX and minimum signal MIN each having a logic high level. When one of the phase increase signal INC and the phase decrease signal DEC is not continuously generated by the number of times corresponding to the threshold value, the up-down counter 310 may maintain the each level of the maximum signal MAX and minimum signal MIN to a logic low level. For example, assuming that the threshold value is 4, when one of the phase increase signal INC and the phase decrease signal DEC is continuously generated four times, the up-down counter 310 may generate the maximum signal MAX and minimum signal MIN each having a logic high level. When the phase increase signal INC and the phase decrease signal DEC are alternately generated, the up-down counter 310 may maintain the each level of the maximum signal MAX and minimum signal MIN to a logic low level. The up-down counter 310 may receive the power-down signal PWRD. The up-down counter 310 may be selectively activated based on the power-down signal PWRD. In the state in which the power-down signal PWRD has been disabled, the up-down counter 310 may be deactivated. When the power-down signal PWRD is enabled, the up-down counter 310 may be activated to perform a counting operation.

The inverter 321 may receive the power-down signal PWRD and output an inverted power-down signal by inverting the power-down signal PWRD. The first OR gate 331 may receive the maximum signal MAX and the output signal of the inverter 321. When any one of the maximum signal MAX and the output signal of the inverter 321 has a logic high level, the first OR gate 331 may output a signal having a logic high level. The second OR gate 332 may receive the minimum signal MIN and the output signal of the inverter 321. When any one of the minimum signal MIN and the output signal of the inverter 321 has a logic high level, the second OR gate 332 may output a signal having a logic high level. The third OR gate 333 may receive the output signals of the first and second OR gates 331 and 332 and output the enable signal EN2. When any one of the output signals of the first and second OR gates 331 and 332 has a logic high level, the third OR gate 333 may enable the logic level of the enable signal EN2 to a logic high level.

Figure 4:
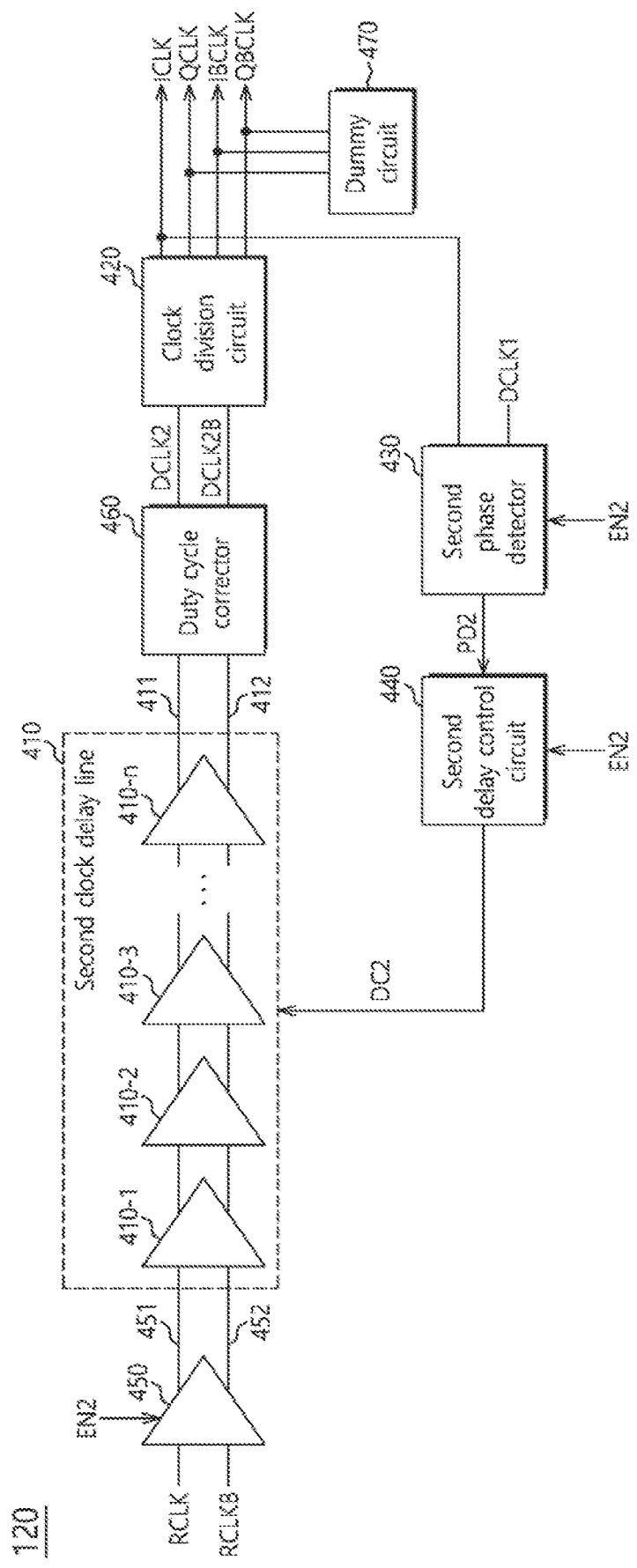
FIG. 4 is a diagram illustrating a configuration of a second delay loop circuit illustrated in FIG. 1.

FIG. 4 is a diagram illustrating a configuration of the second delay loop circuit 120 illustrated in FIG. 1. Referring to FIG. 4, the second delay loop circuit 120 may include a second clock delay line 410, a clock division circuit 420, a second phase detector 430 and a second delay control circuit 440. The second clock delay line 410 may generate a second delay locked clock signal DCLK2 and a complementary second delay locked clock signal DCLK2B by receiving the first and second reception clock signals RCLK and RCLKB. The second clock delay line 410 may delay the first and second reception clock signals RCLK and RCLKB and provide delayed clock signals 411 and 412 as the second delay locked clock signal DCLK2 and the complementary second delay locked clock signal DCLK2B. The second clock delay line 410 may receive a second delay control signal DC2 and delay the first and second reception clock signals RCLK and RCLKB based on the second delay control signal DC2. The amount of delay of the second clock delay line 410 may be changed based on the second delay control signal DC2. The second clock delay line 410 may be a differential CML delay line and may include a plurality of CML delay cells 410-1, 410-2, 410-3, . . . , and 410-n. The plurality of CML delay cells 410-1, 410-2, 410-3, . . . , and 410-n may be sequentially coupled in series. The plurality of CML delay cells 410-1, 410-2, 410-3, . . . , and 410-n may generate output clock signals having opposite phases by differentially amplifying input clock signals. At least one of the plurality of CML delay cells 410-1, 410-2, 410-3, . . . , and 410-n may receive the enable signal EN2 (not shown). For example, the CML delay cell 410-1 that is foremost positioned among the plurality of CML delay cells 410-1, 410-2, 410-3, . . . , and 410-n and that receives the first and second reception clock signals RCLK and RCLKB may receive the enable signal EN2. The CML delay cell 410-1 may be selectively activated based on the enable signal EN2. When the enable signal EN2 is enabled, the CML delay cell 410-1 may be activated, so that the second delay locked clock signal DCLK2 and the complementary second delay locked clock signal DCLK2B are generated through the second clock delay line 410.

The clock division circuit 420 may receive the second delay locked clock signal DCLK2 and the complementary second delay locked clock signal DCLK2B. The clock division circuit 420 may generate at least the first internal clock signal ICLK, the second internal clock signal QCLK, the third internal clock signal IBCLK, and the fourth internal clock signal QBCLK by dividing the frequencies of the second delay locked clock signal DCLK2 and complementary second delay locked clock signal DCLK2B. The clock division circuit 420 may divide the frequencies of the second delay locked clock signal DCLK2 and complementary second delay locked clock signal DCLK2B at a CML voltage level. The clock division circuit 420 may convert the voltage level of a divided clock signal into a CMOS voltage level and output the first to fourth internal clock signals ICLK, QCLK, IBCLK, and QBCLK. The CML voltage level may mean a limited voltage level. A clock signal divided by the clock division circuit 420 may swing at a limited voltage level. The CMOS voltage level may mean an unlimited voltage level. The first to fourth internal clock signals ICLK, QCLK, IBCLK, and QBCLK may substantially full-swing.

The second phase detector 430 may receive the first internal clock signal ICLK and receive the first delay locked clock signal DCLK1 generated by the first delay loop circuit 110. The second phase detector 430 may generate a second phase detection signal PD2 by comparing the phases of the first internal clock signal ICLK and first delay locked clock signal DCLK1. The second phase detector 430 may have substantially the same configuration as the first phase detector 240 illustrated in FIG. 2. The second phase detector 430 may change a logic level of the second phase detection signal PD2 based on whether the phase of the first internal clock signal ICLK is earlier or later than the phase of the first delay locked clock signal DCLK1. The second phase detector 430 may receive the enable signal EN2. The second phase detector 430 may be selectively activated based on the enable signal EN2. When the enable signal EN2 is enabled, the second phase detector 430 may be activated to perform a phase detection operation. When the enable signal EN2 is disabled, the second phase detector 430 might not perform a phase detection operation.

The second delay control circuit 440 may receive the second phase detection signal PD2 and generate the second delay control signal DC2 based on the second phase detection signal PD2. The second delay control signal DC2 may be an update signal to change the amount of delay of the second clock delay line 410. The second delay control circuit 440 may generate the second delay control signal DC2 in various manners and change the amount of delay of the second clock delay line 410. In an embodiment, the second delay control circuit 440 may perform a function similar to that of the first delay control circuit 250. The second delay control signal DC2 may include a phase increase signal and a phase decrease signal like the first delay control signal DC1. The second clock delay line 410 may increase the number of delay cells activated when the phase increase signal is received, and may decrease the number of delay cells activated when the phase decrease signal is received. In an embodiment, the second delay control circuit 440 may include a charge pump, and may generate the second delay control signal DC2, that is, an analog voltage, through the charge pump. The second delay control signal DC2 may be input to the plurality of CML delay cells 410-1, 410-2, 410-3, . . . , and 410-n configuring the second clock delay line 410, and may adjust the amount of delay of the second clock delay line 410 by adjusting the amount of current of the plurality of CML delay cells 410-1, 410-2, 410-3, . . . , and 410-n. In an embodiment, the second delay control circuit 440 may further include an analog to digital converter, and may generate the second delay control signal DC2 by converting an analog voltage, generated based on the second phase detection signal PD2, into a digital signal. The second delay control signal DC2 may be input to the plurality of CML delay cells 410-1, 410-2, 410-3, . . . , and 410-n configuring the second clock delay line 410, and may adjust the amount of delay of the second clock delay line 410 by adjusting the amount of current of the plurality of CML delay cells 410-1, 410-2, 410-3, . . . , and 410-n. The second delay control circuit 440 may receive the enable signal EN2. The second delay control circuit 440 may be selectively activated based on the enable signal EN2. When the enable signal EN2 is enabled, the second delay control circuit 440 may be activated to generate the second delay control signal DC2. When the enable signal EN2 is disabled, the second delay control circuit 440 may be deactivated and may not generate the second delay control signal DC2.

The second delay loop circuit 120 may further include a second clock buffer 450. The second clock buffer 450 may buffer the first and second reception clock signals RCLK and RCLKB, and may provide buffered clock signals 451 and 452 to the second clock delay line 410. The buffered clock signals 451 and 452 may be differential signals having opposite phases. The second clock delay line 410 may be modified to generate the second delay locked clock signal DCLK2 and the complementary second delay locked clock signal DCLK2B by delaying the buffered clock signals 451 and 452 output by the second clock buffer 450. The second clock buffer 450 may receive the enable signal EN2. If the second clock buffer 450 is configured to receive the enable signal EN2, at least one of the plurality of CML delay cells 410-1, 410-2, 410-3, ..., and 410-n configuring the second clock delay line 410 might not receive the enable signal EN2. That is, the CML delay cell 410-1 may be designed so as not to receive the enable signal EN2. The second clock buffer 450 may be selectively activated based on the enable signal EN2. When the enable signal EN2 is enabled, the second clock buffer 450 may provide the buffered clock signals 451 and 452 to the second clock delay line 410. When the enable signal EN2 is disabled, the second clock buffer 450 may block the buffered clock signals 451 and 452 from being output to the second clock delay line 410.

The second delay loop circuit 120 may further include a duty cycle corrector 460. The duty cycle corrector 460 may be coupled between the second clock delay line 410 and the clock division circuit 420. The duty cycle corrector 460 may receive the clock signals 411 and 412 delayed by the second clock delay line 410, and may generate the second delay locked clock signal DCLK2 and the complementary second delay locked clock signal DCLK2B by correcting the duty cycles of the delayed clock signals 411 and 412. For example, the duty cycle corrector 460 may detect a duty ratio of the delayed clock signals 411 and 412 output by the second clock delay line 410, and may generate the second delay locked clock signal DCLK2 and complementary second delay locked clock signal DCLK2B having a duty ratio of 50 to 50 by correcting the duty cycles of the second delay locked clock signal DCLK2 and complementary second delay locked clock signal DCLK2B based on the detected duty ratio. The duty cycle corrector 460 may be implemented using any publicly-known duty cycle correction circuit.

The second delay loop circuit 120 may further include a dummy circuit 470. The dummy circuit 470 may be coupled to nodes from which the second internal clock signal QCLK, the third internal clock signal IBCLK, and the fourth internal clock signal QBCLK are output. The dummy circuit 470 may model the second phase detector 430. The node from which the first internal clock signal ICLK output may be coupled to the second phase detector 430. Accordingly, the node from which the first internal clock signal ICLK is output may be influenced by a load of the second phase detector 430. The second delay loop circuit 120 couples the dummy circuit 470, which models the second phase detector 430, to the nodes from which the second to fourth internal clock signals QCLK, IBCLK, and QBCLK are output so that the first to fourth internal clock signals ICLK, QCLK, IBCLK, and QBCLK have a constant phase difference, and allows substantially the same load to influence the nodes from which the first to fourth internal clock signals ICLK, QCLK, IBCLK, and QBCLK are output.

Figure 5:
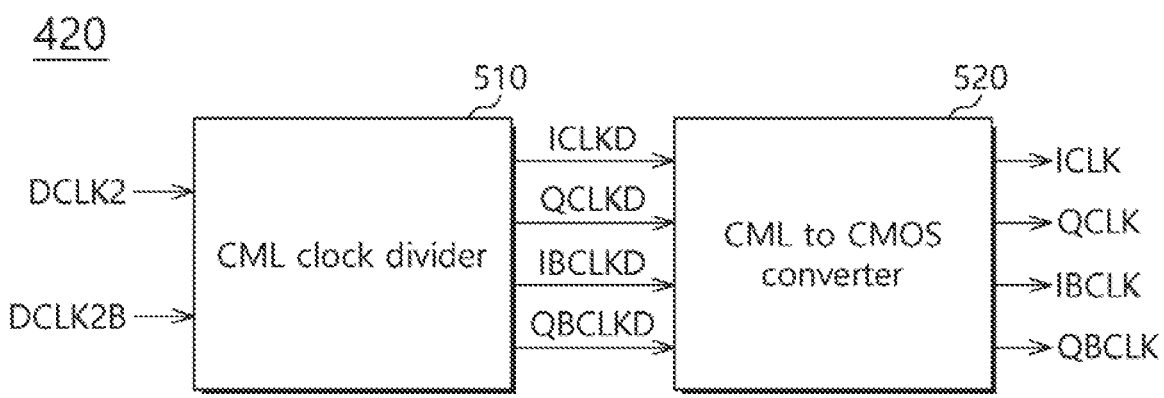
FIG. 5 is a diagram illustrating a configuration of a clock division circuit illustrated in FIG. 4.

FIG. 5 is a diagram illustrating a configuration of the clock division circuit 420 illustrated in FIG. 4. Referring to FIG. 5, the clock division circuit 420 may include a CML clock divider 510 and a CML to CMOS converter 520. The CML clock divider 510 may generate a first division clock signal ICLKD, a second division clock signal QCLKD, a third division clock signal IBCLKD and a fourth division clock signal QBCLKD by receiving the second delay locked clock signal DCLK2 and the complementary second delay locked clock signal DCLK2B. The CML clock divider 510 may generate the first division clock signal ICLKD and the third division clock signal IBCLKD using the second delay locked clock signal DCLK2, the complementary second delay locked clock signal DCLK2B, the second division clock signal QCLKD and the fourth division clock signal QBCLKD. The CML clock divider 510 may generate the second division clock signal QCLKD and the fourth division clock signal QBCLKD using the second delay locked clock signal DCLK2, the complementary second delay locked clock signal DCLK2B, the first division clock signal ICLKD and the third division clock signal IBCLKD. The CML clock divider 510 may generate the first to fourth division clock signals ICLKD, QCLKD, IBCLKD, and QBCLKD each having a CML voltage level. For example, when the CML clock divider 510 operates by receiving a high power voltage having a higher voltage level and a low power voltage having a lower voltage level, the first to fourth division clock signals ICLKD, QCLKD, IBCLKD, and QBCLKD may each have a swing width smaller than a level difference between the high power voltage and the low power voltage. Since the CML clock divider 510 generates the first to fourth division clock signals ICLKD, QCLKD, IBCLKD, and QBCLKD each having a CML voltage level, the CML clock divider 510 may perform a fast and accurate division operation and minimize a phase skew among the first to fourth division clock signals ICLKD, QCLKD, IBCLKD, and QBCLKD.

The CML to CMOS converter 520 may generate the first to fourth internal clock signals ICLK, QCLK, IBCLK, and QBCLK by receiving the first to fourth division clock signals ICLKD, QCLKD, IBCLKD, and QBCLKD. The CML to CMOS converter 520 may generate the first to fourth internal clock signals ICLK, QCLK, IBCLK, and QBCLK by converting each swing widths of the first to fourth division clock signals ICLKD, QCLKD, IBCLKD, and QBCLKD from a CML voltage level to a CMOS voltage level. The CML to CMOS converter 520 may generate, from the first to fourth division clock signals ICLKD, QCLKD, IBCLKD, and QBCLKD each limitedly swinging at the CML voltage level, the first to fourth internal clock signals ICLK, QCLK, IBCLK, and QBCLK each full-swinging at the CMOS voltage level. The first internal clock signal ICLK may have a phase corresponding to the first division clock signal ICLKD. The second internal clock signal QCLK may have a phase corresponding to the second division clock signal QCLKD. The third internal clock signal IBCLK may have a phase corresponding to the third division clock signal IBCLKD. The fourth internal clock signal QBCLK may have a phase corresponding to the fourth division clock signal QBCLKD. The CML to CMOS converter 520 may generate the first internal clock signal ICLK and the third internal clock signal IBCLK based on the first division clock signal ICLKD and the third division clock signal IBCLKD, and may generate the second internal clock signal QCLK and the fourth internal clock signal QBCLK based on the second division clock signal QCLKD and the fourth division clock signal QBCLKD.

FIG. 6 is a diagram illustrating a configuration of the CML clock divider 510 illustrated in FIG. 5. Referring to FIG. 6, the CML clock divider 510 may include a first divider 610 and a second divider 620. The first divider 610 may include a first level shift circuit 611 and a first level maintenance circuit 612. The first level shift circuit 611 may change logic levels of the first division clock signal ICLKD and the third division clock signal IBCLKD based on the second delay locked clock signal DCLK2, the second division clock signal QCLKD and the fourth division clock signal QBCLKD. The first level maintenance circuit 612 may maintain logic levels of the first and third division clock signals ICLKD and IBCLKD based on the complementary second delay locked clock signal DCLK2B, the first division clock signal ICLKD and the third division clock signal IBCLKD.

The first level shift circuit 611 may include a first transistor T11, a second transistor T12, and a third transistor T13. The first to third transistors T11, T12, and T13 may be N channel MOS transistors. The first transistor T11 may have a gate to which the second delay locked clock signal DCLK2 is input, and may have a source coupled to a terminal 601 to which a low power voltage is supplied through a current source S11. The second transistor T12 may have a gate to which the second division clock signal QCLKD is input, may have a drain coupled to a first output node ON11, and may have a source coupled to a drain of the first transistor T11. The first division clock signal ICLKD may be output through the first output node ON11. The third transistor T13 may have a gate to which the fourth division clock signal QBCLKD is input, may have a drain coupled to a second output node ON12, and may have a source coupled to the drain of the first transistor T11. The third division clock signal IBCLKD may be output through the second output node ON12. A first resistor R11 may be coupled between the first output node ON11 and a terminal 602 to which a high power voltage is supplied. A second resistor R12 may be coupled between the second output node ON12 and the terminal 602 to which the high power voltage is supplied. The first and second resistors R11 and R12 may have substantially the same resistance value. The high power voltage may have a higher voltage level than the low power voltage.

The first level maintenance circuit 612 may include a fourth transistor T14, a fifth transistor T15 and a sixth transistor T16. The fourth to sixth transistors T14, T15, and T16 may be N channel MOS transistors. The fourth transistor T14 may have a gate to which the complementary second delay locked clock signal DCLK2B is input, and may have a source coupled to the terminal 601 to which the low power voltage is supplied through the current source S11. The fifth transistor T15 may have a gate coupled to the second output node ON12, may have a drain coupled to the first output node ON11, and may have a source coupled to a drain of the fourth transistor T14. The sixth transistor T16 may have a gate coupled to the first output node ON11, may have a drain coupled to the second output node ON12, and may have a source coupled to the drain of the fourth transistor T14.

The second divider 620 may include a second level shift circuit 621 and a second level maintenance circuit 622. The second level shift circuit 621 may change logic levels of the second division clock signal QCLKD and fourth division clock signal QBCLKD based on the complementary second delay locked clock signal DCLK2B, the first division clock signal ICLKD and the third division clock signal IBCLKD. The second level maintenance circuit 622 may maintain logic levels of the second and fourth division clock signals QCLKD and QBCLKD based on the second delay locked clock signal DCLK2, the second division clock signal QCLKD and the fourth division clock signal QBCLKD.

The second level shift circuit 621 may include a first transistor T21, a second transistor T22, and a third transistor T23. The first to third transistors T21, T22, and T23 may be N channel MOS transistors. The first transistor T21 may have a gate to which the complementary second delay locked clock signal DCLK2B is input, and may have a source coupled to the terminal 601 to which the low power voltage is supplied through a current source S21. The second transistor T22 may have a gate to which the third division clock signal IBCLKD is input, may have a drain coupled to a third output node ON21, and may have a source coupled to a drain of the first transistor T21. The second division clock signal QCLKD may be output through the third output node ON21. The third transistor T23 may have a gate to which the first division clock signal ICLKD is input, may have a drain coupled to a fourth output node ON22, and may have a source coupled to the drain of the first transistor T21. The fourth division clock signal QBCLKD may be output through the fourth output node ON22. A first resistor R21 may be coupled between the third output node ON21 and the terminal 602 to which the high power voltage is supplied. A second resistor R22 may be coupled between the fourth output node ON22 and the terminal 602 to which the high power voltage is supplied. The first and second resistors R21 and R22 may have substantially the same resistance value.

The second level maintenance circuit 622 may include a fourth transistor T24, a fifth transistor T25 and a sixth transistor T26. The fourth and sixth transistors T24, T25, and T26 may be N channel MOS transistors. The fourth transistor T24 may have a gate to which the second delay locked clock signal DCLK2 is input, and may have a source coupled to the terminal 601 to which the low power voltage is supplied through the current source S21. The fifth transistor T25 may have a gate coupled to the fourth output node ON22, may have a drain coupled to the third output node ON21, and may have a source coupled to a drain of the fourth transistor T24. The sixth transistor T26 may have a gate coupled to the third output node ON21, may have a drain coupled to the fourth output node ON22, and may have a source coupled to the drain of the fourth transistor T24.

Figure 7:
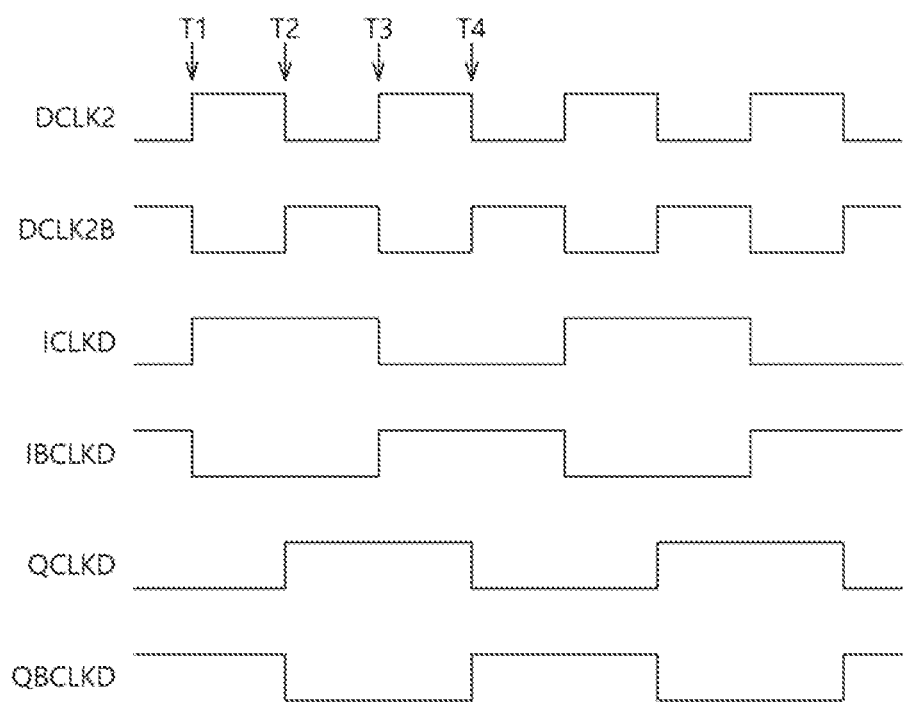
FIG. 7 is a timing diagram illustrating an operation of the CML clock divider illustrated in FIG. 6.

FIG. 7 is a timing diagram illustrating an operation of the CML clock divider 510 illustrated in FIG. 6. An operation of the CML clock divider 510 according to an embodiment is described below with reference to FIG. 6 and FIG. 7. At T1, when a logic level of the second delay locked clock signal DCLK2 shifts to a logic high level, the first transistor T11 of the first divider 610 may be turned on and the fourth transistor T14 thereof may be turned off. A voltage level of the first output node ON11 may become higher than a voltage level of the second output node ON12 because the second division clock signal QCLKD has a logic low level and the fourth division clock signal QBCLKD has a logic high level. Accordingly, the first division clock signal ICLKD having a logic high level may be output from the first output node ON11, and the third division clock signal IBCLKD having a logic low level may be output from the second output node ON12.

At T2, when the logic level of the complementary second delay locked clock signal DCLK2B shifts to a logic high level, the fourth transistor T14 of the first divider 610 may be turned on and the first transistor T11 thereof may be turned off. The amount of current flowing through the sixth transistor T16 may become greater than the amount of current flowing through the fifth transistor T15 because the gate of the fifth transistor T15 is coupled to the second output node ON12 and the gate of the sixth transistor T16 is coupled to the first output node ON11. Accordingly, the logic level of the first output node ON11 coupled to the drain of the fifth transistor T15 may be maintained as a logic high level. The first division clock signal ICLKD may maintain a logic high level. The logic level of the second output node ON12 coupled to the drain of the sixth transistor T16 may be maintained as a logic low level. The third division clock signal IBCLKD may maintain a logic low level. When the logic level of the complementary second delay locked clock signal DCLK2B shifts to a logic high level, the first transistor T21 of the second divider 620 may be turned on and the fourth transistor T24 thereof may be turned off. A voltage level of the third output node ON21 may become higher than a voltage level of the fourth output node ON22 because the third division clock signal QCLKD has a logic low level and the first division clock signal ICLKD has a logic high level. Accordingly, the second division clock signal QCLKD having a logic high level may be output from the third output node ON21, and the fourth division clock signal QBCLKD having a logic low level may be output from the fourth output node ON22.

At T3, when the logic level of the second delay locked clock signal DCLK2 shifts to a logic high level again, the first transistor T11 of the first divider 610 may be turned on again and the fourth transistor T14 thereof may be turned off again. A voltage level of the second output node ON12 may become higher than a voltage level of the first output node ON11 because the logic level of the second division clock signal QCLKD has shifted to a logic high level and the logic level of the fourth division clock signal QBCLKD has shifted to a logic low level. Accordingly, the first division clock signal ICLKD having a logic low level may be output through the first output node ON11, and the third division clock signal IBCLKD having a logic high level may be output through the second output node ON12. At this time, the fourth transistor T24 of the second divider 620 may be turned on, and the first transistor T21 thereof may be turned off. The amount of current flowing through the sixth transistor T26 may become greater than the amount of current flowing through the fifth transistor T25 because the gate of the fifth transistor T25 is coupled to the fourth output node ON22 and the gate of the sixth transistor T26 is coupled to the third output node ON21. Accordingly, the logic level of the third output node ON21 coupled to the drain of the fifth transistor T25 may be maintained as a logic high level, and the second division clock signal QCLKD may maintain a logic high level. The logic level of the fourth output node ON22 coupled to the drain of the sixth transistor T26 may be maintained as a logic low level, and the fourth division clock signal QBCLKD may maintain a logic low level.

At T4, when the logic level of the complementary second delay locked clock signal DCLK2B shifts to a logic high level again, the fourth transistor T14 of the first divider 610 may be turned on and the first transistor T11 thereof may be turned off. The amount of current flowing through the fifth transistor T15 may become greater than the amount of current flowing through the sixth transistor T16 because the gate of the fifth transistor T15 is coupled to the second output node ON12 and the gate of the sixth transistor T16 is coupled to the first output node ON11. Accordingly, the logic level of the first output node ON11 coupled to the drain of the fifth transistor T15 may be maintained as a logic low level, and the first division clock signal ICLKD may maintain a logic low level. The logic level of the second output node ON12 coupled to the drain of the sixth transistor T16 may be maintained as a logic high level, and the third division clock signal IBCLKD may maintain a logic high level. When the logic level of the complementary second delay locked clock signal DCLK2B shifts to a logic high level, the first transistor T21 of the second divider 620 may be turned on and the fourth transistor T24 thereof may be turned off. A voltage level of the fourth output node ON22 may become higher than a voltage level of the third output node ON21 because the third division clock signal IBCLKD has a logic high level and the first division clock signal ICLKD has a logic low level. Accordingly, the second division clock signal QCLKD having a logic low level may be output from the third output node ON21, and the fourth division clock signal QBCLKD having a logic high level may be output from the fourth output node ON22. Thereafter, whenever the logic levels of the second delay locked clock signal DCLK2 and the complementary second delay locked clock signal DCLK2B each shift to a logic high level, the logic levels of the first to fourth division clock signals ICLKD, QCLKD, IBCLKD, and QBCLKD are shifted or maintained. Accordingly, the first to fourth division clock signals ICKD, QCLKD, IBCLKD, and QBCLKD each having a lower frequency and longer cycle than the second delay locked clock signal DCLK2 and the complementary second delay locked clock signal DCLK2B may be generated.

Figure 8:
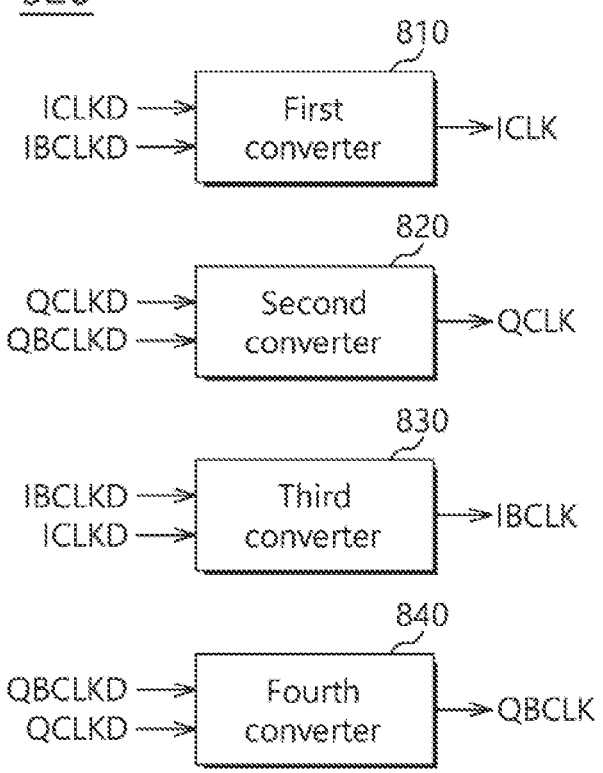
FIG. 8 is a diagram illustrating a configuration of a CML to CMOS converter illustrated in FIG. 5.

FIG. 8 is a diagram illustrating a configuration of the CML to CMOS converter 520 illustrated in FIG. 5. Referring to FIG. 8, the CML to CMOS converter 520 may include a first converter 810, a second converter 820, a third converter 830 and a fourth converter 840. Each of the first to fourth converters 810, 820, 830, and 840 may receive two clock signals each swinging at a CML level, and may output a single clock signal swinging at a CMOS level. The first converter 810 may generate the first internal clock signal ICLK by receiving the first division clock signal ICLKD and the third division clock signal IBCLKD. The first converter 810 may generate the first internal clock signal ICLK by detecting and amplifying the phase of the first division clock signal ICLKD to the phase of the third division clock signal IBCLKD. The first converter 810 may generate the first internal clock signal ICLK having substantially the same phase as the first division clock signal ICLKD and having a greater amplitude than the first division clock signal ICLKD. The second converter 820 may generate the second internal clock signal QCLK by receiving the second division clock signal QCLKD and the fourth division clock signal QBCLKD. The second converter 820 may generate the second internal clock signal QCLK by detecting and amplifying the phase of the second division clock signal QCLKD to the phase of the fourth division clock signal QBCLKD. The second converter 820 may generate the second internal clock signal QCLK having substantially the same phase as the second division clock signal QCLKD and having a greater amplitude than the second division clock signal QCLKD. The third converter 830 may generate the third internal clock signal IBCLK by receiving the third division clock signal IBCLKD and the first division clock signal ICLKD. The third converter 830 may generate the third internal clock signal IBCLK by detecting and amplifying the phase of the third division clock signal IBCLKD to the phase of the first division clock signal ICLKD. The third converter 830 may generate the third internal clock signal IBCLK having substantially the same phase as the third division clock signal IBCLKD and having a greater amplitude than the third division clock signal IBCLKD. The fourth converter 840 may generate the fourth internal clock signal QBCLK by receiving the fourth division clock signal QBCLKD and the second division clock signal QCLKD. The fourth converter 840 may generate the fourth internal clock signal QBCLK by detecting and amplifying the phase of the fourth division clock signal QBCLKD to the phase of the second division clock signal QCLKD. The fourth converter 840 may generate the fourth internal clock signal QBCLK having substantially the same phase as the fourth division clock signal QBCLKD and having a greater amplitude than the fourth division clock signal QBCLKD.

Figure 9:
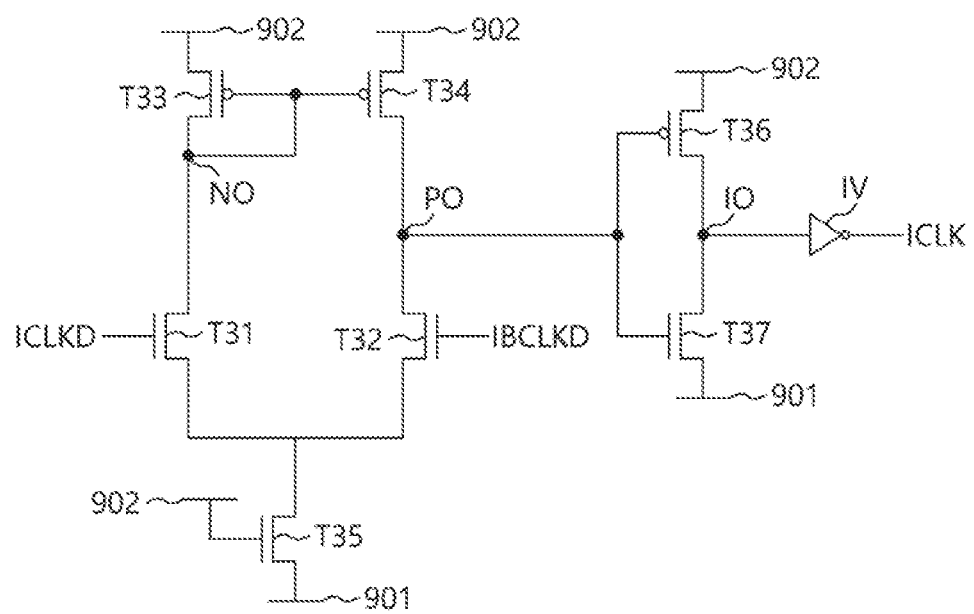
FIG. 9 is a diagram illustrating a configuration of a first converter illustrated in FIG. 8.

FIG. 9 is a diagram illustrating a configuration of the first converter 810 illustrated in FIG. 8. Referring to FIG. 9, the first converter 810 may include a first transistor T31, a second transistor T32, a third transistor T33, a fourth transistor T34, a fifth transistor T35, a sixth transistor T36, a seventh transistor T37 and an inverter IV. The first transistor T31, the second transistor T32, the fifth transistor T35, and the seventh transistor T37 may be N channel MOS transistors. The third transistor T33, the fourth transistor T34 and the sixth transistor T36 may be P channel MOS transistors. The first to fifth transistors T31, T32, T33, T34, and T35 may form a CMOS buffer structure. The first transistor T31 may be coupled between a negative output node NO and a terminal 901 to which a low power voltage is supplied, and may have a gate to which the first division clock signal ICLKD is input. The second transistor T32 may be coupled between a positive output node PO and the terminal 901 to which the low power voltage is supplied, and may have a gate to the third division clock signal IBCLKD is input. The third transistor T33 may be coupled between the negative output node NO and a terminal 902 to which a high power voltage is supplied. The fourth transistor T34 may be coupled between the positive output node PO and the terminal 902 to which the high power voltage is supplied. The gate of the fourth transistor T34, together with a gate of the third transistor T33, may be coupled to the negative output node NO. The third and fourth transistors T33 and T34 may form a current mirror so that substantially the same amount of current can be supplied to the negative output node NO and the positive output node PO. The fifth transistor T35 may be coupled between the first and second transistors T31 and T32 and the terminal 901 to which the low power voltage is supplied, and may have a gate coupled to the terminal 902 to which the high power voltage is supplied. The fifth transistor T35 may function as a current source that forms a current path from the first and second transistors T31 and T32 to the terminal 901 to which the low power voltage is supplied.

The sixth transistor T36 may be coupled between an inverting output node IO and the terminal 902 to which the high power voltage is supplied, and may have a gate coupled to the positive output node PO. The seventh transistor T37 may be coupled between the inverting output node IO and the terminal 901 to which the low power voltage is supplied, and may have a gate coupled to the positive output node PO. The sixth transistor T36 and the seventh transistor T37 may form an inverter, may invert a signal output from the positive output node PO, and may output the inverted signal through the inverting output node IO. The input terminal of the inverter IV may be coupled to the inverting output node IO. The first internal clock signal ICLK may be generated from the output terminal of the inverter IV. A voltage level of the positive output node PO may vary depending on a voltage level of the first division clock signal ICLKD because the third division clock signal IBCLKD has a phase opposite the phase of the first division clock signal ICLKD. The sixth and seventh transistors T36 and T37 may invert a signal output from the positive output node PO, and may output the inverted signal to the inverting output node IO. The inverter IV may invert the signal output from the inverting output node IO, and may output the inverted signal as the first internal clock signal ICLK. The first division clock signal ICLKD swinging at a CML voltage level may be converted into the first internal clock signal ICLKD, swinging at a CMOS voltage level, while being driven through the CMOS buffer and the inverters. The second to fourth converters 820, 830, and 840 may each have the same configuration as the first converter 810 except an input signal and an output signal.

Figure 10:
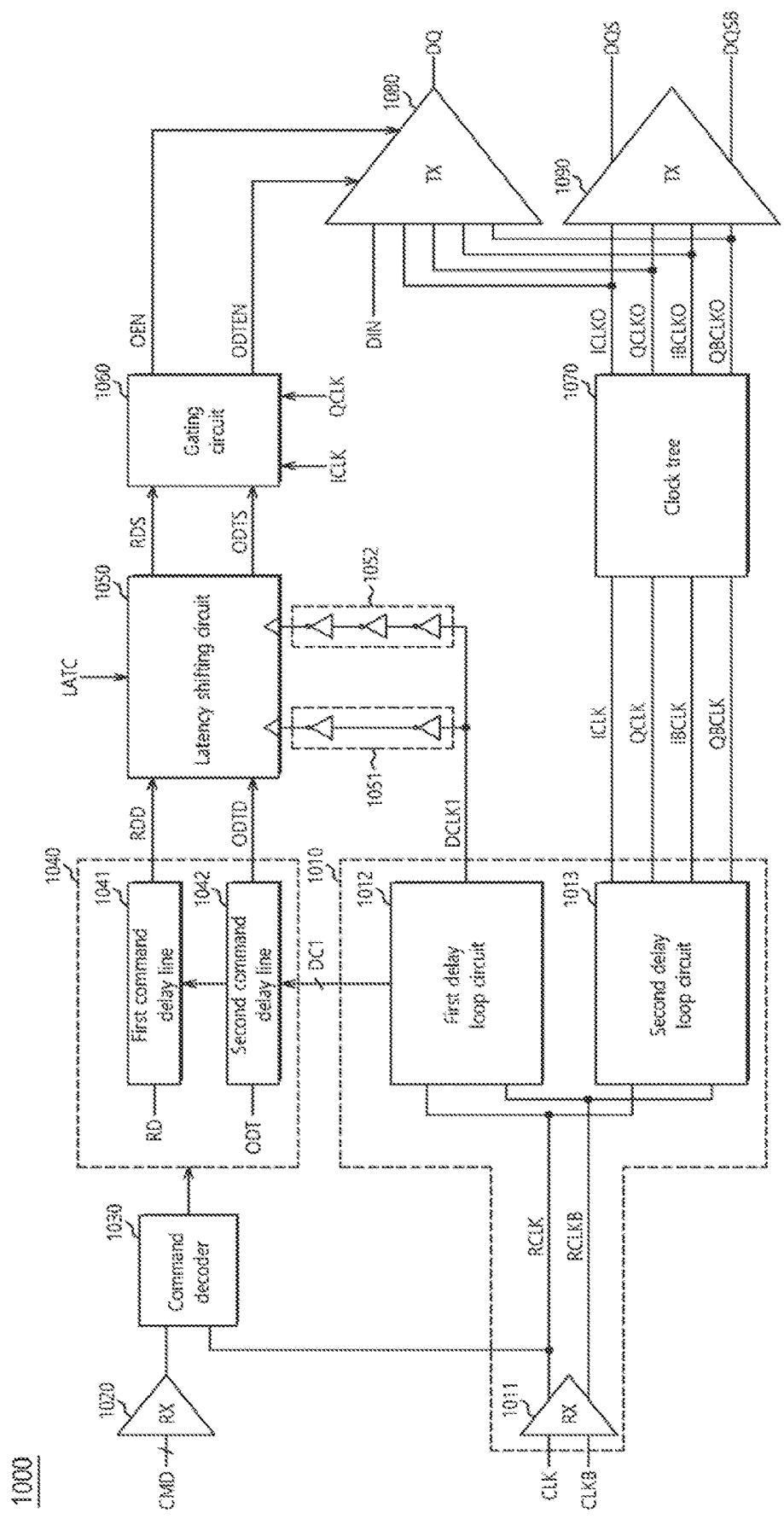
FIG. 10 is a diagram illustrating a configuration of a semiconductor device according to an embodiment.

FIG. 10 is a diagram illustrating a configuration of a semiconductor device 1000 according to an embodiment. Referring to FIG. 10, the semiconductor device 1000 may include a clock generation circuit 1010, a command receiver 1020, a command decoder 1030, a command delay line 1040, a latency shifting circuit 1050, a gating circuit 1060, a clock tree 1070, a data transmitter 1080 and a data strobe transmitter 1090. The clock generation circuit 1010 may include a clock receiver 1011, a first delay loop circuit 1012 and a second delay loop circuit 1013. The clock receiver 1011 may generate a first reception clock signal RCLK and a second reception clock signal RCLKB by receiving a first clock signal CLK and a second clock signal CLKB. The first delay loop circuit 1012 may generate a first delay locked clock signal DCLK1 based on the first and second reception clock signals RCLK and RCLKB. The first delay loop circuit 1012 may include a single-ended CMOS clock delay line, and may generate the first delay locked clock signal DLCK1 by delaying a reference clock signal, generated from the first and second reception clock signals RCLK and RCLKB, based on the reference clock signal and the first delay locked clock signal DCLK1. The second delay loop circuit 1013 may generate a first internal clock signal ICLK based on the first and second reception clock signals RCLK and RCLKB. The second delay loop circuit 1013 may include a differential current mode logic (CML) clock delay line, and may generate the first internal clock signal ICLK by delaying the first and second reception clock signals RCLK and RCLKB based on the first delay locked clock signal DCLK1 and the first internal clock signal ICLK. The second delay loop circuit 1013 may generate a second internal clock signal QCLK, a third internal clock signal IBCLK and a fourth internal clock signal QBCLK along with the first internal clock signal ICLK. The configurations and operations of the clock generation circuit 100 described with reference to FIGS. 1 to 8 may be applied to the clock generation circuit 1010, and a description of the same or similar element is omitted herein.

The command receiver 1020 may receive a command signal CMD. The command signal CMD may be a signal transmitted by an external device of the semiconductor device 1000. The command signal CMD may be a signal including a plurality of bits. The command decoder 1030 may generate an internal command signal by decoding the command signal CMD received from the command receiver 1020. The command decoder 1030 may generate the internal command signal by latching the output of the command receiver 1020 in synchronization with the first reception clock signal RCLK and decoding the latched command signal. The internal command signal may include various signals that enable the semiconductor device 1000 to perform various operations. For example, the internal command signal may include a read signal RD and an on-die termination signal ODT. The read signal RD may be generated to enable the semiconductor device 1000 to perform an operation of outputting data DQ to the external device based on internal data DIN. The on-die termination signal ODT may be generated to enable the semiconductor device 1000 to perform an operation of setting an impedance value of a data bus through which the data DQ is transmitted.

The command delay line 1040 may generate a delay command signal by receiving the internal command signal. The command delay line 1040 may generate the delay command signal by delaying the internal command signal. Referring to FIGS. 2 and 10 together, the command delay line 1040 may delay the internal command signal as much as substantially the same time as the time that the reference clock signal REFCLK is delayed through the first clock delay line 220 in the first delay loop circuit 1012. The command delay line 1040 may include a first command delay line 1041 and a second command delay line 1042. The first command delay line 1041 may receive the read signal RD and generate a delay read signal RDD by delaying the read signal RD. The second command delay line 1042 may receive the on-die termination signal ODT and generate a delay on-die termination signal ODTD by delaying the on-die termination signal ODT. The delay command signal may include the delay read signal RDD and the delay on-die termination signal ODTD. The first and second command delay lines 1041 and 1042 may each have the same amount of delay as a clock delay line included in the first delay loop circuit 1012. For example, the first and second command delay lines 1041 and 1042 may each have the same amount of delay as the first clock delay line 220. The first and second command delay lines 1041 and 1042 may each receive a first delay control signal DC1 generated by the first delay loop circuit 1012. The amounts of delay of the first and second command delay lines 1041 and 1042 may be set based on the first delay control signal DC1.

The latency shifting circuit 1050 may generate a synchronization command signal by delaying the delay command signal as much as the time corresponding to latency, in synchronization with at least one internal clock signal ICLK. The latency shifting circuit 1050 may receive the delay read signal RDD and the delay on-die termination signal ODTD output by the first and second command delay lines 1041 and 1042, and may receive the first delay locked clock signal DCLK1 from the first delay loop circuit 1012. Furthermore, the latency shifting circuit 1050 may receive a latency signal LATC. The latency signal LATC may include information on latency. The latency signal LATC may be a signal provided by a mode register set and/or state machine for storing operation information of the semiconductor device 1000. The latency included in the latency signal LATC may be an integer of 1 or more. Time corresponding to the latency may be latency*1tCK. The 1tCK may be time corresponding to one cycle of the first clock signal CLK. The latency may include various types of time information, such as CAS latency, read latency, write latency, CAS write latency, and additive latency. The latency shifting circuit 1050 may generate a synchronization read signal RDS by delaying the read signal RD as much as time corresponding to latency included in the latency signal LATC, in synchronization with at least one of the first delay locked clock signal DCLK1 and the complementary signal of the first delay locked clock signal DCLK1. The latency shifting circuit 1050 may generate a synchronization on-die termination signal ODTS by delaying the on-die termination signal ODT as much as time corresponding to the latency, in synchronization with at least one of the first delay locked clock signal DCLK1 and the complementary signal of the first delay locked clock signal. The synchronization command signal may include the synchronization read signal RDS and the synchronization on-die termination signal ODTS. The semiconductor device 1000 may further include a non-inverting buffer 1051 and an inverting buffer 1052. The non-inverting buffer 1051 may perform non-inverting buffering on the first delay locked clock signal DCLK1, and may provide the non-inverting-buffered first delay locked clock signal to the latency shifting circuit 1050. The inverting buffer 1052 may perform inverting buffering on the first delay locked clock signal DCLK1, and may provide the complementary signal of the inverting-buffered first delay locked clock signal DCLK1 to the latency shifting circuit 1050.

The gating circuit 1060 may generate an output control signal by synchronizing the synchronization command signal with at least one internal clock signal. The gating circuit 1060 may receive the synchronization read signal RDS and synchronization on-die termination signal ODTS output by the latency shifting circuit 1050. The gating circuit 1060 may receive the first internal clock signal ICLK and second internal clock signal QCLK output by the second delay loop circuit 1013. The gating circuit 1060 may generate an output enable signal OEN by synchronizing the synchronization read signal RDS with the first internal clock signal ICLK. The gating circuit 1060 may generate an on-die termination enable signal ODTEN by synchronizing the synchronization on-die termination signal ODTS with the second internal clock signal QCLK. The output control signal may include the output enable signal OEN and the on-die termination enable signal ODTEN. In an embodiment, the gating circuit 1060 may receive the third internal clock signal IBCLK along with the first internal clock signal ICLK, and may generate the output enable signal OEN by synchronizing the synchronization read signal RDS with at least one of the first internal clock signal ICLK and the third internal clock signal IBCLK. The gating circuit 1060 may receive the fourth internal clock signal QBCLK along with the second internal clock signal QCLK, and may generate the on-die termination enable signal ODTEN by synchronizing the synchronization on-die termination signal ODTS with at least one of the second internal clock signal QCLK and the fourth internal clock signal QCLKB.

The clock tree 1070 may receive the first to fourth internal clock signals ICLK, QCLK, IBCLK, and QBCLK, and may generate first to fourth output clock signals ICLKO, QCLKO, IBCLKO, and QBCLKO by delaying the first to fourth internal clock signals ICLK, QCLK, IBCLK, and QBCLK. The clock tree 1070 may generate the first output clock signal ICLKO by delaying the first internal clock signal ICLK, may generate the second output clock signal QCLKO by delaying the second internal clock signal QCLK, may generate the third output clock signal IBCLKO by delaying the third internal clock signal IBCLK, and may generate the fourth output clock signal QBCLKO by delaying the fourth internal clock signal QBCLK.

The data transmitter 1080 may output the data DQ based on the internal data DIN of the semiconductor device 1000. The data transmitter 1080 may receive the internal data DIN, the output enable signal OEN, the on-die termination enable signal ODTEN, and the first to fourth output clock signals ICLKO, QCLKO, IBCLKO, and QBCLKO. The internal data DIN may include a plurality of data signals. When the data transmitter 1080 is activated based on the output enable signal OEN, the data transmitter 1080 may output the plurality of data signals to the data DQ in sequential synchronization with the first to fourth output clock signals ICLKO, QCLKO, IBCLKO, and QBCLKO. Impedance for the data transmitter 1080 may be set based on the on-die termination enable signal ODTEN.

The data strobe transmitter 1090 may receive the first to fourth output clock signals ICLKO, QCLKO, IBCLKO, and QBCLKO from the clock tree 1070. The data strobe transmitter 1090 may output a data strobe signal pair DQS and DQSB based on the first to fourth output clock signals ICLKO, QCLKO, IBCLKO, and QBCLKO. For example, the data strobe transmitter 1090 may output the data strobe signal DQS based on the first output clock signal ICLK and the third output clock signal ICLKO. The data strobe transmitter 1090 may output the complementary signal DQSB of the data strobe signal based on the second output clock signal QCLKO and the fourth output clock signal QBCLKO.

The semiconductor device 1000 may set the amount of delay of the command delay line 1040 through the first delay loop circuit 1012. The latency shifting circuit 1050 may operate based on the first delay locked clock signal DCLK1 generated by the first delay loop circuit 1012. Accordingly, power consumption necessary to delay the internal command signal can be minimized. In order for the semiconductor device 1000 to perform smooth data communication with an external device, the data strobe signal pair DQS and DQSB needs to be output at accurate timing with an accurate phase difference. Accordingly, the semiconductor device 1000 may generate the data strobe signal pair DQS and DQSB based on the first to fourth internal clock signals ICLK, QCLK, IBCLK, and QBCLK generated by the second delay loop circuit 1013 which has relatively great power consumption, but has high performance. Furthermore, the gating circuit 1060 operates based on the first internal clock signal ICLK and second internal clock signal QCLK generated by the second delay loop circuit 1013. Accordingly, the synchronization read signal RDS and synchronization on-die termination signal ODTS delayed by the first delay loop circuit 1012 can be generated as the output enable signal OEN and the on-die termination enable signal ODTEN at more precise timing.

Figure 11:
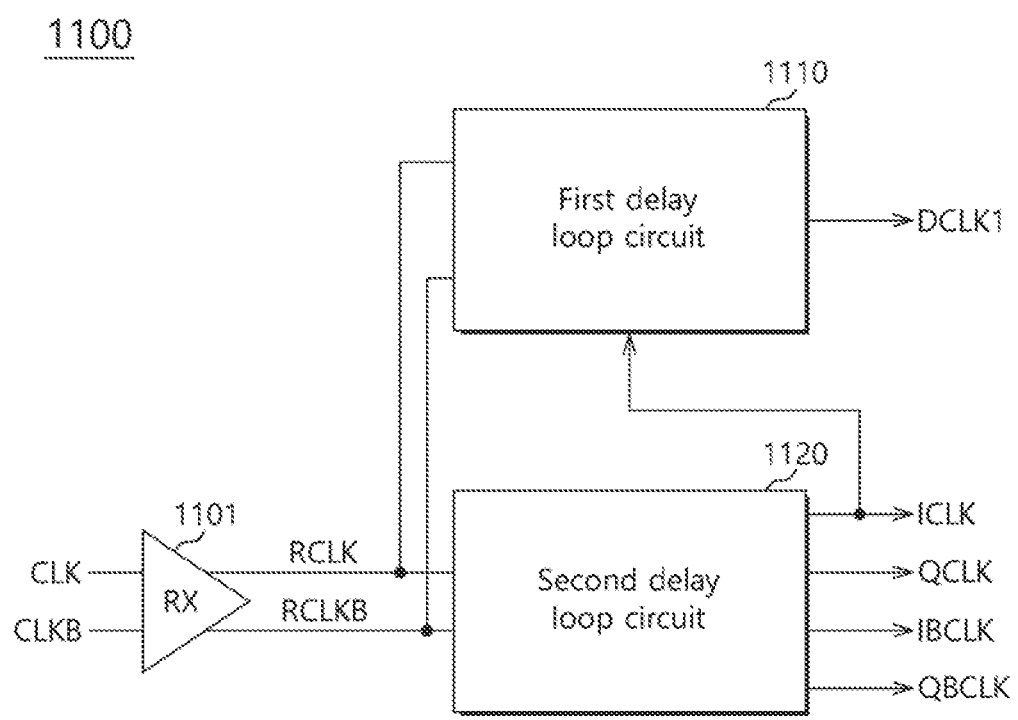
FIG. 11 is a diagram illustrating a configuration of a clock generation circuit according to an embodiment.

FIG. 11 is a diagram illustrating a configuration of a clock generation circuit 1100 according to an embodiment. Referring to FIG. 11, the clock generation circuit 1100 may include a clock receiver 1101, a first delay loop circuit 1110 and a second delay loop circuit 1120. The clock generation circuit 1100 may have a configuration similar to that of the clock generation circuit 100 illustrated in FIG. 1, and thus a redundant description of the same element is omitted herein. The clock receiver 1101 may receive a first clock signal CLK and a second clock signal CLKB. The clock receiver 1101 may generate a first reception clock signal RCLK and a second reception clock signal RCLKB by differentially amplifying the first clock signal CLK and the second clock signal CLKB. The first delay loop circuit 1110 may receive the first and second reception clock signals RCLK and RCLKB. The first delay loop circuit 1110 may generate a first delay locked clock signal DCLK1 by delaying the first and second reception clock signals RCLK and RCLKB. The first delay loop circuit 1110 may receive a first internal clock signal ICLK generated by the second delay loop circuit 1120. The first delay loop circuit 1110 may change the amount of delay of the first delay locked clock signal DCLK1 by comparing the phases of the first delay locked clock signal DCLK1 and first internal clock signal ICLK. The first delay loop circuit 1110 may generate the first delay locked clock signal DCLK1 having substantially the same phase as the first internal clock signal ICLK.

The second delay loop circuit 1120 may receive the first and second reception clock signals RCLK and RCLKB, and may generate the first internal clock signal ICLK by performing a delay-locking operation on the first and second reception clock signals RCLK and RCLKB. The second delay loop circuit 1120 may further generate a second internal clock signal QCLK, a third internal clock signal IBCLK and a fourth internal clock signal QBCLK by performing delay-locking operations on the first and second reception clock signals RCLK and RCLKB. In the clock generation circuit 100 of FIG. 1, the first delay loop circuit 110 may perform a delay-locking operation on the reference clock signal REFCLK generated from the first and second reception clock signals RCLK and RCLKB, and the second delay loop circuit 120 may receive the first delay locked clock signal DCLK1 output by the first delay loop circuit 110, and may generate the first internal clock signal ICLK having substantially the same phase as the first delay locked clock signal DCLK1. In contrast, in the clock generation circuit 1100 of FIG. 11, the second delay loop circuit 1120 may perform delay-locking operations on the first and second reception clock signals RCLK and RCLKB, and the first delay loop circuit 1110 may receive the first internal clock signal ICLK output by the second delay loop circuit 1120, and may generate the first delay locked clock signal DCLK1 having substantially the same phase as the first internal clock signal ICLK.

Figure 12:
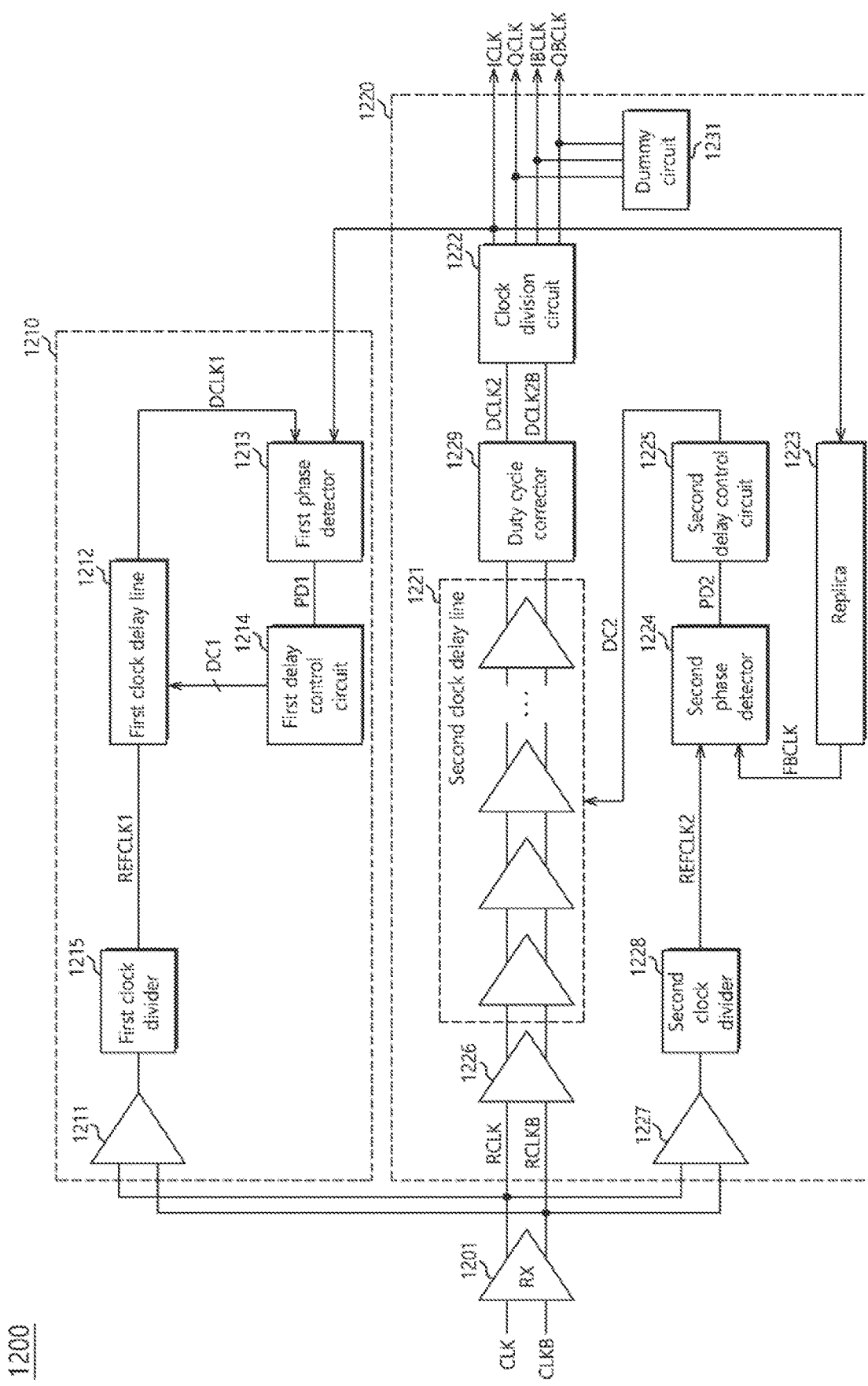
FIG. 12 is a diagram illustrating a configuration of a clock generation circuit according to an embodiment.

FIG. 12 is a diagram illustrating a configuration of a clock generation circuit 1200 according to an embodiment. Referring to FIG. 12, the clock generation circuit 1200 may include a clock receiver 1201, a first delay loop circuit 1210 and a second delay loop circuit 1220. The first delay loop circuit 1210 may include a first clock buffer 1211, a first clock delay line 1212, a first phase detector 1213 and a first delay control circuit 1214. The second delay loop circuit 1220 may include a second clock delay line 1221, a clock division circuit 1222, a replica 1223, a second phase detector 1224 and a second delay control circuit 1225. The first delay loop circuit 1210 may have a configuration similar to that of the first delay loop circuit 110 illustrated in FIG. 2, except that the first delay loop circuit 1210 does not include a replica and the first phase detector 1213 compares the phases of a first delay locked clock signal DCLK1 and first internal clock signal ICLK. The second delay loop circuit 1220 may have a configuration similar to that of the second delay loop circuit 120 illustrated in FIG. 4, except that the second delay loop circuit 1220 includes the replica 1223 and the second phase detector 1224 compares the output of the replica 1223 and the phase of the reception clock signal RCLK. A redundant description of the same element is omitted herein.

The first clock buffer 1211 may buffer first and second reception clock signals RCLK and RCLKB and provide the buffered clock signal as a first reference clock signal REFCLK1. The first clock delay line 1212 may generate the first delay locked clock signal DCLK1 by delaying the first reference clock signal REFCLK1. The first clock delay line 1212 may delay the first reference clock signal REFCLK1 based on a first delay control signal DC1. The amount of delay of the first clock delay line 1212 may be changed based on the first delay control signal DC1.

The first phase detector 1213 may receive the first delay locked clock signal DCLK1 and the first internal clock signal ICLK output by the second delay loop circuit 1220. The first phase detector 1213 may generate a first phase detection signal PD1 by comparing the phases of the first delay locked clock signal DCLK1 and first internal clock signal ICLK. The first phase detector 1213 may detect whether the phase of the first delay locked clock signal DCLK1 is earlier or later than the phase of the first internal clock signal ICLK, and may change a logic level of the first phase detection signal PD1. The first delay control circuit 1214 may receive the first phase detection signal PD1 generated by the first phase detector 1213. The first delay control circuit 1214 may generate the first delay control signal DC1 based on the first phase detection signal PD1.

The first delay loop circuit 1210 may further include a first clock divider 1215. The first clock divider 1215 may be coupled between the first clock buffer 1211 and the first clock delay line 1212. The first clock divider 1215 may divide the frequency of the buffered clock signal output by the first clock buffer 1211, and may provide the divided clock signal as the first reference clock signal REFCLK1.

The second clock delay line 1221 may generate a second delay locked clock signal DCLK2 and a complementary second delay locked clock signal DCLK2B by delaying the first and second reception clock signals RCLK and RCLKB. The second clock delay line 1221 may receive a second delay control signal DC2, and may delay the first and second reception clock signals RCLK and RCLKB based on the second delay control signal DC2. The amount of delay of the second clock delay line 1221 may be changed based on the second delay control signal DC2. The clock division circuit 1222 may receive the second delay locked clock signal DCLK2 and the complementary second delay locked clock signal DCLK2B. The clock division circuit 1222 may generate the first internal clock signal ICLK, a second internal clock signal QCLK, a third internal clock signal IBCLK and a fourth internal clock signal QBCLK by dividing the frequencies of the second delay locked clock signal DCLK2 and the complementary second delay locked clock signal DCLK2B.

The replica 1223 may receive the first internal clock signal ICLK, and may generate the feedback clock signal FBCLK by delaying the first internal clock signal ICLK by a modeled delay time. The second phase detector 1224 may generate a second phase detection signal PD2 by comparing the phases of the feedback clock signal FBCLK and a second reference clock signal REFCLK2. The second phase detection signal PD2 may change a logic level of the second phase detection signal PD2 based on whether the phase of the second reference clock signal REFCLK2 is earlier or later than the phase of the feedback clock signal FBCLK. The second reference clock signal REFCLK2 may be generated from the first and second reception clock signals RCLK and RCLKB. The second delay control circuit 1225 may receive the second phase detection signal PD2, and may generate the second delay control signal DC2 based on the second phase detection signal PD2. The second delay control signal DC2 may be an update signal to change the amount of delay of the second clock delay line 1221.

The second delay loop circuit 1220 may further include a second clock buffer 1226. The second clock buffer 1226 may be coupled between the clock receiver 1201 and the second clock delay line 1221. The second clock buffer 1226 may buffer the first and second reception clock signals RCLK and RCLKB and provide the buffered clock signals to the second clock delay line 1221. The buffered clock signals may have phases corresponding to the first and second reception clock signals RCLK and RCLKB, and may be differential signals having opposite phases. The second clock delay line 1221 may be modified to generate the second delay locked clock signal DCLK2 and the complementary second delay locked clock signal DCLK2B by delaying the buffered clock signals.

The second delay loop circuit 1220 may further include a third clock buffer 1227 and a second clock divider 1228. The third clock buffer 1227 and the second clock divider 1228 may be sequentially coupled in series between the clock receiver 1201 and the second phase detector 1224. The third clock buffer 1227 may buffer the first and second reception clock signals RCLK and RCLKB and output the buffered clock signals. The third clock buffer 1227 may have substantially the same structure as the first clock buffer 1211. The second clock divider 1228 may receive a clock signal buffered by the third clock buffer 1227, and may generate the second reference clock signal REFCLK2 by dividing the frequency of the buffered clock signal. The second clock divider 1228 may provide the second reference clock signal REFCLK2 to the second phase detector 1224. In an embodiment, the division ratio of the second clock divider 1228 may be smaller than the division ratio of the first clock divider 1215. For example, when the first clock divider 1215 divides, by 4, the frequency of a clock signal buffered by the first clock buffer 1211, the second clock divider 1228 may divide, by 2, the frequency of a clock signal buffered by the third clock buffer 1227. The division ratio of the clock divider may determine the update cycle of a delay loop circuit. The update cycle of the delay loop circuit may mean the cycle in which the amount of delay of a clock delay circuit included in the delay loop circuit is changed. The update cycle of the second delay loop circuit 1220 may be shorter than the update cycle of the first delay loop circuit 1210.

The second delay loop circuit 1220 may further include a duty cycle corrector 1229. The duty cycle corrector 1229 may be coupled between the second clock delay line 1221 and the clock division circuit 1222. The duty cycle corrector 1229 may receive the clock signals output by the second clock delay line 1221, and may generate the second delay locked clock signal DCLK2 and the complementary second delay locked clock signal DCLK2B by correcting the duty cycles of the clock signals. The second delay loop circuit 1220 may further include a dummy circuit 1231. The dummy circuit 1231 may be coupled to nodes from which the second internal clock signal QCLK, the third internal clock signal IBCLK, and the fourth internal clock signal QBCLK are output. The dummy circuit 1231 may models the second phase detector 1224.

Figure 13:
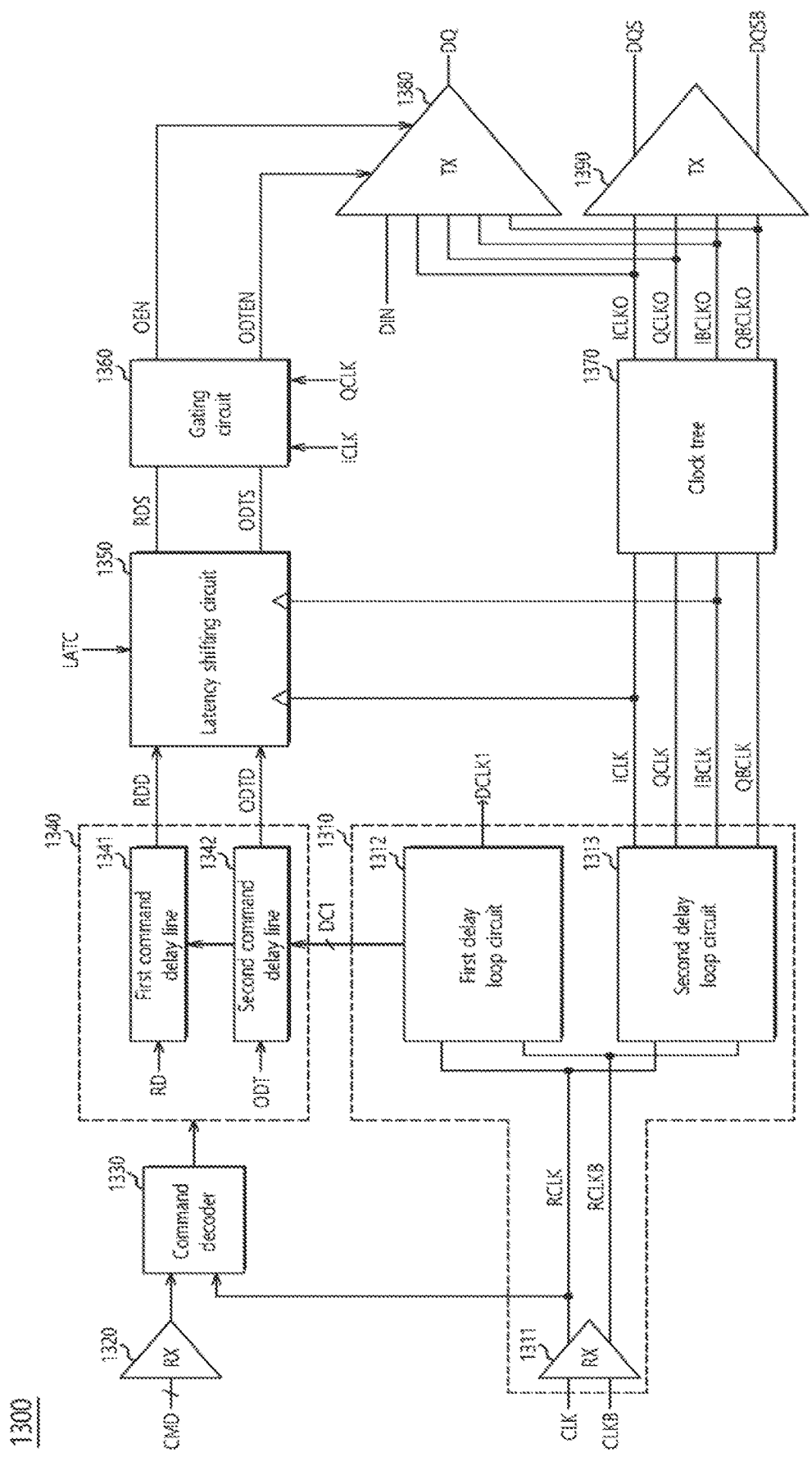
FIG. 13 is a diagram illustrating a configuration of a semiconductor device according to an embodiment.

FIG. 13 is a diagram illustrating a configuration of a semiconductor device 1300 according to an embodiment. The semiconductor device 1300 may have a configuration similar to that of the semiconductor device 1000 illustrated in FIG. 10, except some elements. A redundant description of the same element is omitted herein. Referring to FIG. 13, the semiconductor device 1300 may include a clock generation circuit 1310, a command receiver 1320, a command decoder 1330, a command delay line 1340, a latency shifting circuit 1350, a gating circuit 1360, a clock tree 1370, a data transmitter 1380 and a data strobe transmitter 1390. The clock generation circuit 1310 may include a clock receiver 1311, a first delay loop circuit 1312 and a second delay loop circuit 1313, and may have the same configuration as the clock generation circuit 1100 or 1200 illustrated in FIG. 11 or 12. The clock receiver 1311 may generate a first reception clock signal RCLK and a second reception clock signal RCLKB by receiving a first clock signal CLK and a second clock signal CLKB. The first delay loop circuit 1312 may include a single-ended CMOS clock delay line, and may generate a first delay locked clock signal DCLK1 by delaying a first reference clock signal, generated from the first and second reception clock signals RCLK and RCLKB, based on the first reference clock signal and a first internal clock signal ICLK. The second delay loop circuit 1313 may include a differential current mode logic (CML) clock delay line, and may generate the first internal clock signal ICLK by delaying the first and second reception clock signals RCLK and RCLKB based on the first internal clock signal ICLK and a second reference clock signal generated from the first and second reception clock signals RCLK and RCLKB. The second delay loop circuit 1313 may generate a second internal clock signal QCLK, a third internal clock signal IBCLK and a fourth internal clock signal QBCLK along with the first internal clock signal ICLK.

The command receiver 1320 may receive a command signal CMD. The command decoder 1330 may generate an internal command signal by latching the command signal CMD received from the command receiver 1320 in synchronization with the first reception clock signal RCLK and decoding the latched command signal. The internal command signal may include a read signal RD and an on-die termination signal ODT. The command delay line 1340 may include a first command delay line 1341 and a second command delay line 1342. The first command delay line 1341 may generate a delay read signal RDD by delaying the read signal RD output by the command decoder 1330. The second command delay line 1342 may generate a delay on-die termination signal ODTD by delaying the on-die termination signal ODT output by the command decoder 1330. The first and second command delay lines 1341 and 1342 may each receive a first delay control signal DC1 generated by the first delay loop circuit 1312. The amounts of delay of the first and second command delay lines 1341 and 1342 may be changed based on the first delay control signal DC1.

The latency shifting circuit 1350 may receive the delay read signal RDD and the delay on-die termination signal ODTD from the command delay line 1340. Unlike the case where the latency shifting circuit 1050 illustrated in FIG. 10 receives the first delay locked clock signal DCLK1 generated by the first delay loop circuit 1012, the latency shifting circuit 1350 may receive the first internal clock signal ICLK and the third internal clock signal IBCLK generated by the second delay loop circuit 1313. The latency shifting circuit 1350 may generate a synchronization read signal RDS and a synchronization on-die termination signal ODTS by synchronizing the delay read signal RDD and the delay on-die termination signal ODTD with the first internal clock signal ICLK and the third internal clock signal IBCLK based on a latency signal LATC.

The gating circuit 1360 may receive the synchronization read signal RDS, the synchronization on-die termination signal ODTS, the first internal clock signal ICLK and the second internal clock signal QCLK. The gating circuit 1360 may generate an output enable signal OEN by synchronizing the synchronization read signal RDS with the first internal clock signal ICLK, and may generate an on-die termination enable signal ODTEN by synchronizing the synchronization on-die termination signal ODTS with the second internal clock signal QCLK. The latency shifting circuit 1350 generates the synchronization read signal RDS and the synchronization on-die termination signal ODTS using the first internal clock signal ICLK and the third internal clock signal IBCLK. Accordingly, the output enable signal OEN and the on-die termination enable signal ODTEN can be output by the gating circuit 1360 at more precise timing.

The clock tree 1370 may generate a first output clock signal ICLKO, a second output clock signal QCLKO, a third output clock signal IBCLKO and a fourth output clock signal QBCLKO by delaying the first internal clock signal ICLK, the second internal clock signal QCLK, the third internal clock signal IBCLK and the fourth internal clock signal QBCLK. When the output enable signal OEN is enabled, the data transmitter 1380 may output internal data DIN as data DQ in synchronization with the first to fourth output clock signals ICLKO, QCLKO, IBCLKO, and QBCLKO. Impedance of the data transmitter 1380 may be set based on the on-die termination enable signal ODTEN. The data strobe transmitter 1390 may output a data strobe signal pair DQS and DQSB based on the first to fourth output clock signals ICLKO, QCLKO, IBCLKO, and QBCLKO.

FIG. 14 is a diagram illustrating a configuration of a delay line 1400 in accordance with an embodiment of the disclosure. The delay line 1400 may be applied as each of the second clock delay lines 410 and 1221 illustrated in FIGS. 4 and 12. Referring to FIG. 14, the delay line 1400 may receive a first input clock signal CLKIN and a second input clock signal CLKINB, and may generate a first output clock signal CLKOUT and a second output clock signal CLKOUTB by delaying the first and second input clock signals CLKIN and CLKINB.

The delay line 1400 may include a coarse delay circuit 1410 and a fine delay circuit 1420. The coarse delay circuit 1410 may receive the first input clock signal CLKIN, the second input clock signal CLKINB and a coarse control signal DCC, and may generate a first delayed clock signal pair FCLK and FCLKB and a second delayed clock signal pair SCLK and SCLKB. For example, when the delay line 1400 is applied as the second clock delay line 410 illustrated in FIG. 4, the first and second input clock signals CLKIN and CLKINB may correspond to the first and second reception clock signals RCLK and RCLKB or the buffered clock signals 451 and 452 output from the second clock buffer 450, and the coarse control signal DCC may correspond to the second delay control signal DC2 generated from the second delay control circuit 440 during a coarse delay-locking operation. The coarse delay circuit 1410 may generate the first delayed clock signal pair FCLK and FCLKB and the second delayed clock signal pair SCLK and SCLKB by delaying the first and second input clock signals CLKIN and CLKINB based on the coarse control signal DCC. The second input clock signal CLKINB may be a complementary clock signal of the first input clock signal CLKIN. The second input clock signal CLKINB may have a phase difference of 180 degrees from the first input clock signal CLKIN. The first delayed clock signal pair FCLK and FCLKB may include two delayed clock signals which have a phase difference of 180 degrees. The second delayed clock signal pair SCLK and SCLKB may include two delayed clock signals which have a phase difference of 180 degrees. The coarse delay circuit 1410 may generate each of the first and second delayed clock signal pairs FCLK, FCLKB, SCLK and SCLKB by delaying the first and second input clock signals CLKIN and CLKINB by a unit delay time based on the coarse control signal DCC. The coarse delay circuit 1410 may generate the first delayed clock signal pair FCLK and FCLKB which has the same phase as or has a phase difference corresponding to the unit delay time from the second delayed clock signal pair SCLK and SCLKB. The coarse delay circuit 1410 may change each of phases of the first and second delayed clock signal pairs FCLK, FCLKB, SCLK and SCLKB by the unit delay time.

The fine delay circuit 1420 may receive the first delayed clock signal pair FCLK and FCLKB, the second delayed clock signal pair SCLK and SCLKB and a fine control signal DCF, and may generate the first output clock signal CLKOUT and the second output clock signal CLKOUTB. When the delay line 1400 is applied as the second clock delay line 410 illustrated in FIG. 4, the first and second output clock signals CLKOUT and CLKOUTB may correspond to the delayed clock signals 411 and 412 output from the second clock delay line 410 or the second delay-locked clock signal DCLK2 and the complementary second delay-locked clock signal DCLK2B, and the fine control signal DCF may correspond to the second delay control signal DC2 generated from the second delay control circuit 440 during a fine delay-locking operation. The fine delay circuit 1420 may generate a shifted clock signal pair SSCLK and SSCLKB by delaying the second delayed clock signal pair SCLK and SCLKB by a phase corresponding to substantially half the unit delay time. The fine delay circuit 1420 may generate the first and second output clock signals CLKOUT and CLKOUTB by mixing the phases of the first delayed clock signal pair FCLK and FCLKB and the shifted clock signal pair SSCLK and SSCLKB based on the fine control signal DCF. The second output clock signal CLKOUTB may be a complementary clock signal of the first output clock signal CLKOUT. The second output clock signal CLKOUTB may have a phase difference of 180 degrees from the first output clock signal CLKOUT.

As the coarse delay circuit 1410 provides the first delayed clock signal pair FCLK and FCLKB having the same phases as the second delayed clock signal pair SCLK and SCLKB or having phases lagging behind the second delayed clock signal pair SCLK and SCLKB by the phase corresponding to the unit delay time and the fine delay circuit 1420 mixes the phases of the shifted clock signal pair SSCLK and SSCLKB generated by delaying the second delayed clock signal pair SCLK and SCLKB by the phase corresponding to substantially half the unit delay time and the first delayed clock signal pair FCLK and FCLKB, the resolution of the fine delay circuit 1420 may be increased, and the phases of the first and second output clock signals CLKOUT and CLKOUTB may be more precisely adjusted. For example, when the fine delay circuit 1420 is designed to be capable of changing the phases of the first and second output clock signals CLKOUT and CLKOUTB by a predetermined number of steps, a phase difference between clock signals having phases that are to be mixed may determine the resolution of the fine delay circuit 1420. It is assumed that the fine delay circuit 1420 may perform phase mixing through eight steps. When a phase difference between clock signals having phases that are to be mixed by the fine delay circuit 1420 is a phase corresponding to the unit delay time, the fine delay circuit 1420 may change the phases of the first and second output clock signals CLKOUT and CLKOUTB by a phase corresponding to ⅛ of the unit delay time. However, when a phase difference between clock signals having phases that are to be mixed by the fine delay circuit 1420 is a phase corresponding to substantially half the unit delay time, the fine delay circuit 1420 may change the phases of the first and second output clock signals CLKOUT and CLKOUTB by a phase corresponding to ¹⁄₁₆ of the unit delay time, thereby achieving a double resolution. Therefore, by mixing the phases of the shifted clock signal pair SSCLK and SSCLKB and the first delayed clock signal pair FCLK and FCLKB, the fine delay circuit 1420 may change the phases of the first and second output clock signals CLKOUT and CLKOUTB by a phase corresponding to ¹⁄₁₆ of the unit delay time, even without increasing the number of drivers and the number of control signals of the fine delay circuit 1420, thereby increasing the resolution of the delay line 1400.

The coarse delay circuit 1410 may include a coarse shift register 1411 and a coarse delay line 1412. The coarse shift register 1411 may generate an enable signal EN<1:n>, a first selection signal SEL1<1:n> and a second selection signal SEL2<1:n> based on the coarse control signal DCC. Here, n may be an integer equal to or greater than 3. The number of bits of each of the enable signal EN<1:n>, the first selection signal SEL1<1:n> and the second selection signal SEL2<1:n> may correspond to the number of delay cells included in the coarse delay line 1412. The coarse control signal DCC may include a coarse increase signal INCC and a coarse decrease signal DECC. Based on the coarse increase signal INCC, the coarse shift register 1411 may sequentially increase the number of bits each having a logic high level in the enable signal EN<1:n> and may sequentially change a bit having a logic high level in each of the first selection signal SEL1<1:n> and the second selection signal SEL2<1:n>. Based on the coarse decrease signal DECC, the coarse shift register 1411 may sequentially decrease the number of bits each having a logic high level in the enable signal EN<1:n> and may sequentially change a bit having a logic high level in each of the first selection signal SEL1<1:n> and the second selection signal SEL2<1:n>.

The coarse delay line 1412 may receive the first and second input clock signals CLKIN and CLKINB, and may generate the first delayed clock signal pair FCLK and FCLKB and the second delayed clock signal pair SCLK and SCLKB by delaying the first and second input clock signals CLKIN and CLKINB. The coarse delay line 1412 may include first to nˆth delay cells 1412-1, 1412-2, . . . and 1412-n. The first to nˆth delay cells 1412-1, 1412-2, . . . and 1412-n may be CML delay cells. Each of the first to nˆth delay cells 1412-1, 1412-2, . . . and 1412-n may have a delay time corresponding to the unit delay time of the coarse delay line 1412. A total delay time of the coarse delay line 1412 may be changed depending on the number of delay cells to be activated. The coarse delay line 1412 may change the number of delay cells to be enabled, based on the enable signal EN<1:n>. The first delay cell 1412-1 may be activated based on the first bit EN<1> of the enable signal EN<1:n>. The second delay cell 1412-2 may be activated based on the second bit EN<2> of the enable signal EN<1:n>. The nˆth delay cell 1412-n may be activated based on the nˆth bit EN<n> of the enable signal EN<1:n>. The first delay cell 1412-1 may receive the first and second input clock signals CLKIN and CLKINB, and the first and second delayed clock signal pairs FCLK, FCLKB, SCLK and SCLKB may be output from the first delay cell 1412-1. As the second to nˆth delay cells 1412-2, . . . and 1412-n are sequentially activated, the number of paths through which the first and second input clock signals CLKIN and CLKINB proceed may increase, and thus, delay times of the first and second delayed clock signal pairs FCLK, FCLKB, SCLK and SCLKB may be increased. As the nˆth to second delay cells 1412-n, . . . and 1412-2 are sequentially deactivated, the number of paths through which the first and second input clock signals CLKIN and CLKINB proceed may decrease, and thus, delay times of the first and second delayed clock signal pairs FCLK, FCLKB, SCLK and SCLKB may be decreased. Each of the first to nˆth delay cells 1412-1, 1412-2, . . . and 1412-n may receive bits allocated thereto among the bits of the first and second selection signals SEL1<1:n> and SEL2<1:n>. Each of the first to nˆth delay cells 1412-1, 1412-2, . . . and 1412-n may output one of a clock signal pair delayed by itself and a clock signal pair delayed by a delay cell disposed at a next stage, based on the first and second selection signals SEL1<1:n> and SEL2<1:n>. For example, the first delay cell 1412-1 may select one of a clock signal pair delayed by the first delay cell 1412-1 and a clock signal pair delayed by a delay cell (that is, the second delay cell 1412-2) disposed at a next stage, based on the first bit SEL1<1> of the first selection signal SEL1<1:n>, and may output the selected clock signal pair as the first delayed clock signal pair FCLK and FCLKB. The first delay cell 1412-1 may select one of a clock signal pair delayed by the first delay cell 1412-1 and a clock signal pair delayed by a delay cell (that is, the second delay cell 1412-2) disposed at a next stage, based on the first bit SEL2<1> of the second selection signal SEL2<1:n>, and may output the selected clock signal pair as the second delayed clock signal pair SCLK and SCLKB.

The fine delay circuit 1420 may include a fine shift register 1421 and a phase mixing circuit 1422. The fine shift register 1421 may receive the fine control signal DCF and generate a weight R<1:m>. The fine shift register 1421 may change the weight R<1:m> based on the fine control signal DCF. The fine control signal DCF may include a fine increase signal INCF and a fine decrease signal DECF. For example, the fine shift register 1421 may increase or decrease the value of the weight R<1:m> in a stepwise manner based on the fine increase signal INCF, and may decrease or increase the value of the weight R<1:m> in a stepwise manner based on the fine decrease signal DECF. The weight R<1:m> may be a digital signal which has a plurality of bits. Here, m may be an integer equal to or greater than 2.

The phase mixing circuit 1422 may receive the first delayed clock signal pair FCLK and FCLKB, the second delayed clock signal pair SCLK and SCLKB and the weight R<1:m>. The phase mixing circuit 1422 may generate the shifted clock signal pair SSCLK and SSCLKB by delaying the phases of the second delayed clock signal pair SCLK and SCLKB by a phase corresponding to substantially half the unit delay time. The phase mixing circuit 1422 may generate the first output clock signal CLKOUT and the second output clock signal CLKOUTB by mixing the phases of the first delayed clock signal pair FCLK and FCLKB and the shifted clock signal pair SSCLK and SSCLKB based on the weight R<1:m>.

The phase mixing circuit 1422 may include a CML buffer 1422-1, a first variable driver 1422-2 and a second variable driver 1422-3. The CML buffer 1422-1 may receive the second delayed clock signal pair SCLK and SCLKB, and may generate the shifted clock signal pair SSCLK and SSCLKB by delaying and buffering the second delayed clock signal pair SCLK and SCLKB. A time during which the CML buffer 1422-1 generates the shifted clock signal pair SSCLK and SSCLKB from the second delayed clock signal pair SCLK and SCLKB may correspond to substantially half the unit delay time. The first variable driver 1422-2 may receive the first delayed clock signal pair FCLK and FCLKB and the weight R<1:m>, and may drive the first delayed clock signal pair FCLK and FCLKB based on the weight R<1:m>. The second variable driver 1422-3 may receive the shifted clock signal pair SSCLK and SSCLKB and the weight R<1:m>, and may drive the shifted clock signal pair SSCLK and SSCLKB based on the weight R<1:m>. As the phases of the first delayed clock signal FCLK driven by the first variable driver 1422-2 and the shifted clock signal SSCLK driven by the second variable driver 1422-3 are mixed, the first output clock signal CLKOUT may be generated. As the phases of the first delayed clock signal FCLKB driven by the first variable driver 1422-2 and the shifted clock signal SSCLKB driven by the second variable driver 1422-3 are mixed, the second output clock signal CLKOUTB may be generated. Based on the weight R<1:m>, the driving force of the first variable driver 1422-2 may be changed complementarily to the driving force of the second variable driver 1422-3. For example, as the logic value of the weight R<1:m> becomes smaller, the driving force of the first variable driver 1422-2 may increase and the driving force of the second variable driver 1422-3 may decrease. Conversely, as the logic value of the weight R<1:m> becomes larger, the driving force of the first variable driver 1422-2 may decrease and the driving force of the second variable driver 1422-3 may increase. The phase mixing circuit 1422 may generate the first and second output clock signals CLKOUT and CLKOUTB which have phases close to the phases of the first delayed clock signal pair FCLK and FCLKB as the logic value of the weight R<1:m> becomes smaller, and may generate the first and second output clock signals CLKOUT and CLKOUTB which have phases close to the phases of the shifted clock signal pair SSCLK and SSCLKB as the logic value of the weight R<1:m> becomes larger.

Figure 15:
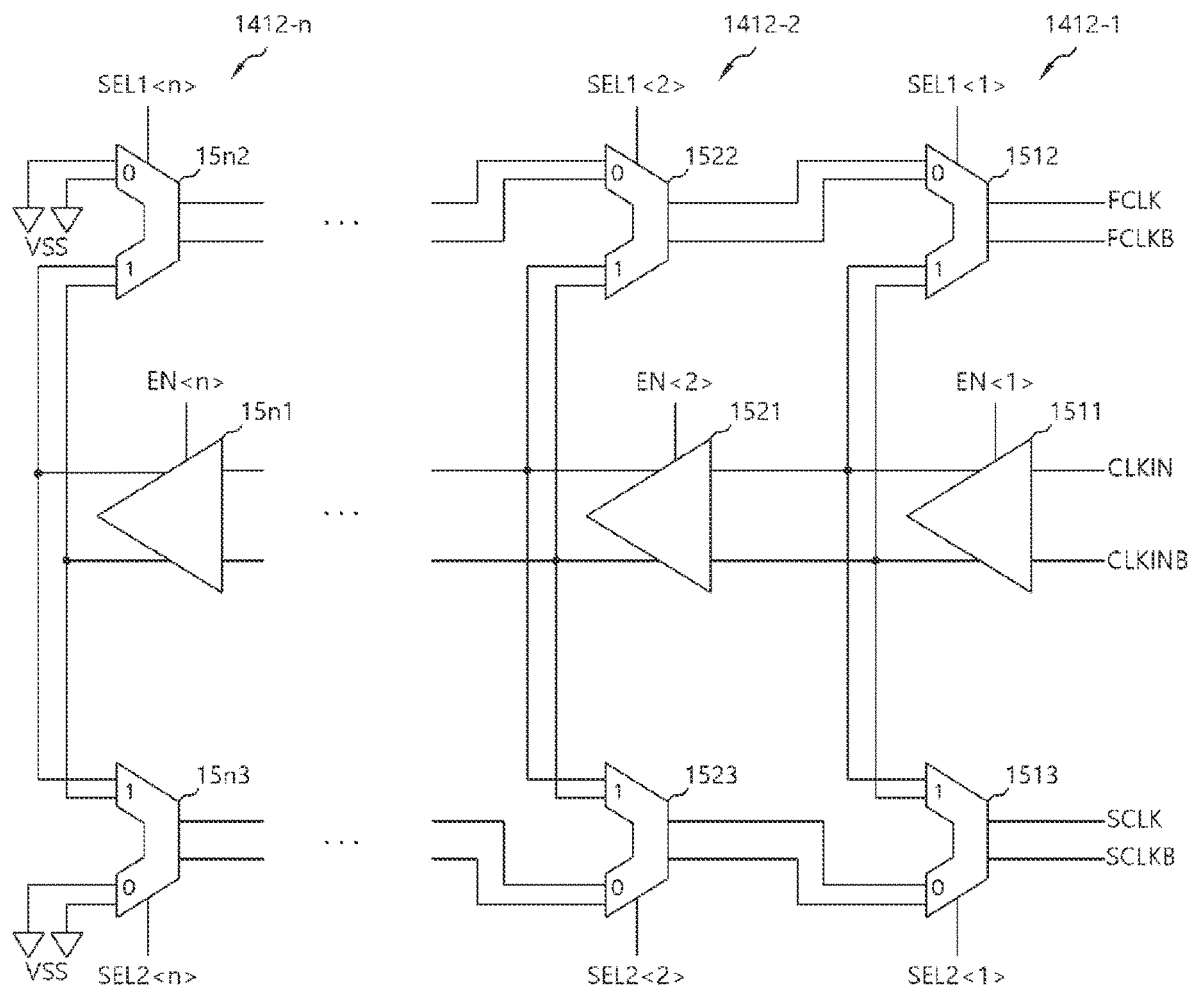
FIG. 15 is a diagram illustrating the configuration of the coarse delay line illustrated in FIG. 14.

FIG. 15 is a diagram illustrating the configuration of the coarse delay line 1412 illustrated in FIG. 14. Referring to FIG. 15, the coarse delay line 1412 may include a plurality of delay cells. The coarse delay line 1412 may include the first delay cell 1412-1, the second delay cell 1412-2 ... and the nˆth delay cell 1412-n. The first to nˆth delay cells 1412-1, 1412-2, ... and 1412-n may have substantially the same structure except that signals to be received and signals to be output are different. The first delay cell 1412-1 may receive the first input clock signal CLKIN and the second input clock signal CLKINB, and may output the first delayed clock signal pair FCLK and FCLKB and the second delayed clock signal pair SCLK and SCLKB. The first delay cell 1412-1 may receive the enable signal EN<1>, the first selection signal SEL1<1> and the second selection signal SEL2<1>. The first delay cell 1412-1 may delay the first and second input clock signals CLKIN and CLKINB based on the enable signal EN<1>. The first delay cell 1412-1 may output one of a clock signal pair delayed by the first delay cell 1412-1 and a clock signal pair delayed by the second delay cell 1412-2, as the first delayed clock signal pair FCLK and FCLKB, based on the first selection signal SEL1<1>. The first delay cell 1412-1 may output one of a clock signal pair delayed by the first delay cell 1412-1 and a clock signal pair delayed by the second delay cell 1412-2, as the second delayed clock signal pair SCLK and SCLKB, based on the second selection signal SEL2<1>. The first delay cell 1412-1 may include a CML buffer 1511, a first CML multiplexer 1512 and a second CML multiplexer 1513. The CML buffer 1511 may receive the first and second input clock signals CLKIN and CLKINB, and may output a delayed clock signal pair by buffering and delaying the first and second input clock signals CLKIN and CLKINB. A time by which the CML buffer 1511 delays the first and second input clock signals CLKIN and CLKINB may correspond to substantially half the unit delay time. The first CML multiplexer 1512 may receive the first selection signal SEL1<1>, a clock signal pair delayed by the CML buffer 1511 and a clock signal pair delayed by the second delay cell 1412-2. The first CML multiplexer 1512 may output one of the clock signal pair delayed by the CML buffer 1511 and the clock signal pair delayed by the second delay cell 1412-2, as the first delayed clock signal pair FCLK and FCLKB, based on the first selection signal SEL1<1>. For example, when the first selection signal SEL1<1> is a logic high level, the first CML multiplexer 1512 may output the clock signal pair delayed by the CML buffer 1511, as the first delayed clock signal pair FCLK and FCLKB. When the first selection signal SEL1<1> is a logic low level, the first CML multiplexer 1512 may output the clock signal pair delayed by the second delay cell 1412-2, as the first delayed clock signal pair FCLK and FCLKB. The delay time of the first CML multiplexer 1512 may correspond to substantially half the unit delay time, and the sum of the delay time of the CML buffer 1511 and the delay time of the first CML multiplexer

1512 may correspond to the unit delay time. The second CML multiplexer 1513 may receive the second selection signal SEL2<1>, a clock signal pair delayed by the CML buffer 1511 and a clock signal pair delayed by the second delay cell 1412-2. The second CML multiplexer 1513 may output one of the clock signal pair delayed by the CML buffer 1511 and the clock signal pair delayed by the second delay cell 1412-2, as the second delayed clock signal pair SCLK and SCLKB, based on the second selection signal SEL2<1>. For example, when the second selection signal SEL2<1> is a logic high level, the second CML multiplexer 1513 may output the clock signal pair delayed by the CML buffer 1511, as the second delayed clock signal pair SCLK and SCLKB. When the second selection signal SEL2<1> is a logic low level, the second CML multiplexer 1513 may output the clock signal pair delayed by the second delay cell 1412-2, as the second delayed clock signal pair SCLK and SCLKB. The delay time of the second CML multiplexer 1513 may correspond to substantially half the unit delay time, and the sum of the delay time of the CML buffer 1511 and the delay time of the second CML multiplexer 1513 may correspond to the unit delay time.

The second delay cell 1412-2 may receive a clock signal pair which is delayed by the CML buffer 1511 of the first delay cell 1412-1. The second delay cell 1412-2 may receive the enable signal EN<2>, the first selection signal SEL1<2> and the second selection signal SEL2<2>. The second delay cell 1412-2 may delay the clock signal pair which is delayed by the CML buffer 1511 of the first delay cell 1412-1, based on the enable signal EN<2>. The second delay cell 1412-2 may output one of a clock signal pair delayed by the second delay cell 1412-2 and a clock signal pair delayed by a third delay cell (not illustrated) disposed at a stage next to the second delay cell 1412-2, to the first delay cell 1412-1, based on the first selection signal SEL1<2>. The second delay cell 1412-2 may output one of a clock signal pair delayed by the second delay cell 1412-2 and a clock signal pair delayed by the third delay cell, to the first delay cell 1412-1, based on the second selection signal SEL2<2>. The second delay cell 1412-2 may include a CML buffer 1521, a first CML multiplexer 1522 and a second CML multiplexer 1523. The CML buffer 1521 may receive the clock signal pair delayed by the CML buffer 1511 of the first delay cell 1412-1, and may output a delayed clock signal pair by buffering and delaying the clock signal pair delayed by the CML buffer 1511 of the first delay cell 1412-1. The first CML multiplexer 1522 may receive the first selection signal SEL1<2>, the clock signal pair delayed by the CML buffer 1521 and a clock signal pair delayed by the third delay cell. The first CML multiplexer 1522 may output one of the clock signal pair delayed by the CML buffer 1521 and the clock signal pair delayed by the third delay cell, to the first CML multiplexer 1512 of the first delay cell 1412-1, based on the first selection signal SEL1<2>. For example, when the first selection signal SEL1<2> is a logic high level, the first CML multiplexer 1522 may output the clock signal pair delayed by the CML buffer 1521, to the first CML multiplexer 1512 of the first delay cell 1412-1. When the first selection signal SEL1<2> is a logic low level, the first CML multiplexer 1522 may output the clock signal pair delayed by the third delay cell, to the first CML multiplexer 1512 of the first delay cell 1412-1. The second CML multiplexer 1523 may receive the second selection signal SEL2<2>, the clock signal pair delayed by the CML buffer 1521 and the clock signal pair delayed by the third delay cell. The second CML multiplexer 1523 may output one of the clock signal pair delayed by the CML buffer 1521 and the clock signal pair delayed by the third delay cell, to the second CML multiplexer 1513 of the first delay cell 1412-1, based on the second selection signal SEL2<2>. For example, when the second selection signal SEL2<2> is a logic high level, the second CML multiplexer 1523 may output the clock signal pair delayed by the CML buffer 1521, to the second CML multiplexer 1513 of the first delay cell 1412-1. When the second selection signal SEL2<2> is a logic low level, the second CML multiplexer 1523 may output the clock signal pair delayed by the third delay cell, to the second CML multiplexer 1513 of the first delay cell 1412-1.

The n^th delay cell 1412-$n$ may receive a clock signal pair which is delayed by a delay cell (i.e., an (n−1)^th delay cell (not illustrated)) disposed at a previous stage. The n^th delay cell 1412-$n$ may receive the enable signal EN<n>, the first selection signal SEL1<n> and the second selection signal SEL2<n>. The n^th delay cell 1412-$n$ may delay the clock signal pair which is delayed by a CML buffer of the (n−1)^th delay cell, based on the enable signal EN<n>. The n^th delay cell 1412-$n$ may output a clock signal pair which is delayed by the n^th delay cell 1412-$n$, to the (n−1)^th delay cell, based on the first selection signal SEL1<n>. The n^th delay cell 1412-$n$ may output the clock signal pair which is delayed by the n^th delay cell 1412-$n$, to the (n−1)^th delay cell, based on the second selection signal SEL2<n>. The n^th delay cell 1412-$n$ may include a CML buffer 15$n$1, a first CML multiplexer 15$n$2 and a second CML multiplexer 15$n$3. The CML buffer 15$n$1 may receive the clock signal pair delayed by the CML buffer of the (n−1)^th delay cell, and may output a delayed clock signal pair by buffering and delaying the clock signal pair delayed by the CML buffer of the (n−1)^th delay cell. The first CML multiplexer 15$n$2 may receive the first selection signal SEL1<n>, the clock signal pair delayed by the CML buffer 15$n$1 and a ground voltage VSS. The first CML multiplexer 15$n$2 may output one of the clock signal pair delayed by the CML buffer 15$n$1 and the ground voltage VSS, to a first CML multiplexer of the (n−1)^th delay cell, based on the first selection signal SEL1<n>. When the first selection signal SEL1<n> is a logic high level, the first CML multiplexer 15$n$2 may output the clock signal pair delayed by the CML buffer 15$n$1, to the first CML multiplexer of the (n−1)^th delay cell. The second CML multiplexer 15$n$3 may receive the second selection signal SEL2<n>, the clock signal pair delayed by the CML buffer 15$n$1 and the ground voltage VSS. The second CML multiplexer 15$n$3 may output one of the clock signal pair delayed by the CML buffer 15$n$1 and the ground voltage VSS, to a second CML multiplexer of the (n−1)^th delay cell, based on the second selection signal SEL2<n>. When the second selection signal SEL2<n> is a logic high level, the second CML multiplexer 15$n$3 may output the clock signal pair delayed by the CML buffer 15$n$1, to the second CML multiplexer of the (n−1)^th delay cell.

Figure 16:
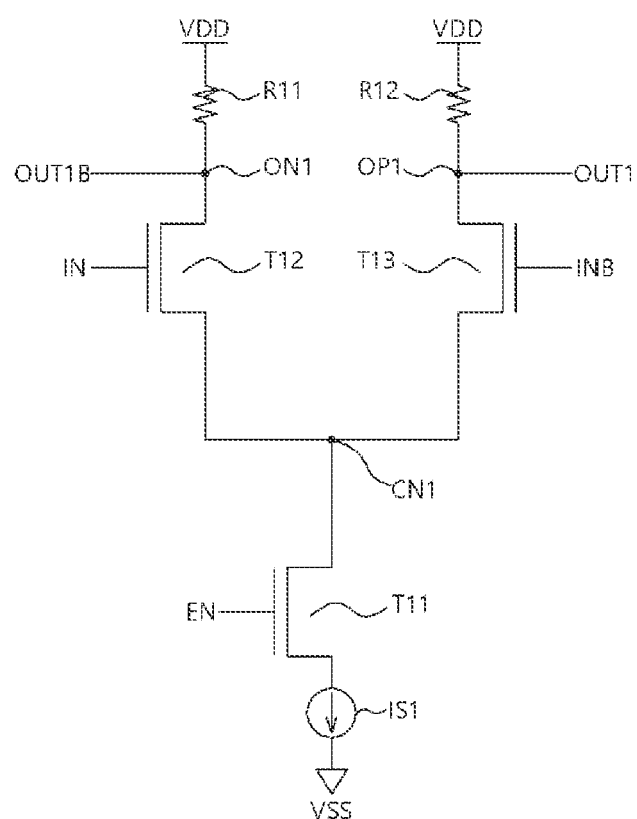
FIG. 16 is a diagram illustrating the configuration of a CML buffer 1600 in accordance with an embodiment of the disclosure.

FIG. 16 is a diagram illustrating the configuration of a CML buffer 1600 in accordance with an embodiment of the disclosure. The CML buffer 1600 may be applied as each of the CML buffers 1511, 1521, ... and 15$n$1 illustrated in FIG. 15. Referring to FIG. 16, the CML buffer 1600 may generate an output signal pair OUT1 and OUT1B by differentially amplifying an input signal pair IN and INB. The CML buffer 1600 may include a first transistor T11, a second transistor T12 and a third transistor T13. Each of the first to third transistors T11, T12 and T13 may be an N-channel MOS transistor. The first transistor T11 may be coupled between a common node CN1 and a terminal to which the ground voltage VSS is supplied, and the gate of the first transistor T11 may receive an enable signal EN. When the enable signal EN is enabled, the first transistor T11 may form a current path from the common node CN1 to the terminal to which the ground voltage VSS is supplied. The second transistor T12 may be coupled between a negative output node ON1 and the common node CN1, and the gate of the second transistor T12 may receive a first input signal IN. The second transistor T12 may change the voltage level of the negative output node ON1 by coupling the negative output node ON1 to the common node CN1 based on the voltage level of the first input signal IN. A negative output signal OUT1B may be output from the negative output node ON1. The third transistor T13 may be coupled between a positive output node OP1 and the common node CN1, and the gate of the third transistor T13 may receive a second input signal INB. The second input signal INB may be a complementary signal which has a logic level opposite to that of the first input signal IN. The third transistor T13 may change the voltage level of the positive output node OP1 by coupling the positive output node OP1 to the common node CN1 based on the voltage level of the second input signal INB. A positive output signal OUT1 may be output from the positive output node OP1. The CML buffer 1600 may further include a first load resistor R11 and a second load resistor R12. The first load resistor R11 may be coupled between a terminal to which a power voltage VDD is supplied and the negative output node ON1. The second load resistor R12 may be coupled between a terminal to which the power voltage VDD is supplied and the positive output node OP1. The CML buffer 1600 may further include a current source IS1. The current source IS1 may be coupled to the common node CN1 and a terminal to which the ground voltage VSS is supplied, and may allow a constant current to flow from the common node CN1 to the terminal to which the ground voltage VSS is supplied.

Figure 17:
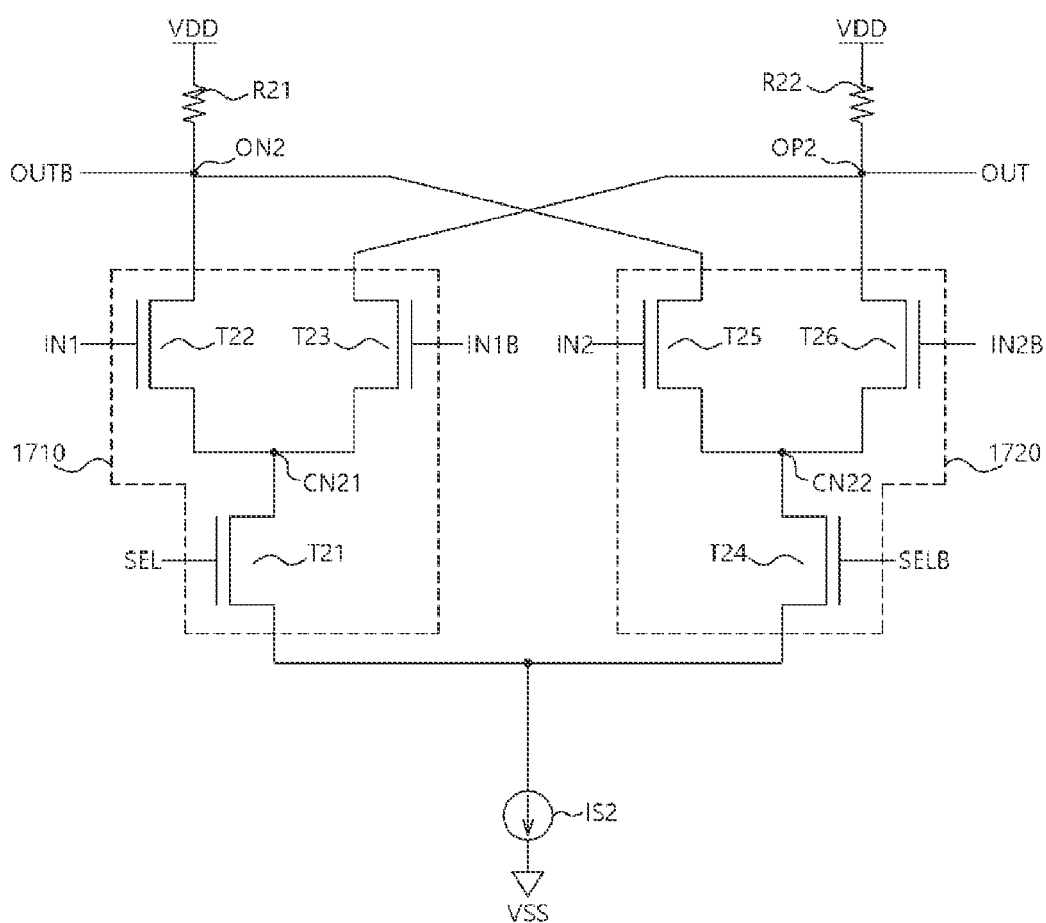
FIG. 17 is a diagram illustrating the configuration of a CML multiplexer according to an embodiment.

FIG. 17 is a diagram illustrating the configuration of a CML multiplexer 1700 in accordance with an embodiment of the disclosure. The CML multiplexer 1700 may be applied as each of the CML multiplexers 1512, 1513, 1522, 1523, 15n2 and 15n3 illustrated in FIG. 15. The CML multiplexer 1700 may include two amplifier circuits which selectively operate based on a selection signal SEL. The CML multiplexer 1700 may include a first amplifier circuit 1710 and a second amplifier circuit 1720. The first amplifier circuit 1710 may generate an output signal pair OUT and OUTB by differentially amplifying a first input signal pair IN1 and IN1B when the selection signal SEL has a first logic level. The second amplifier circuit 1720 may generate the output signal pair OUT and OUTB by differentially amplifying a second input signal pair IN2 and IN2B when the selection signal SEL has a second logic level.

The first amplifier circuit 1710 may include a first transistor T21, a second transistor T22 and a third transistor T23. Each of the first to third transistors T21, T22 and T23 may be an N-channel MOS transistor. The first transistor T21 may be coupled between a first common node CN21 and a terminal to which the ground voltage VSS is supplied, and the gate of the first transistor T21 may receive the selection signal SEL. When the selection signal SEL is enabled to a logic high level, the first transistor T21 may form a current path from the first common node CN21 to the terminal to which the ground voltage VSS is supplied. The second transistor T22 may be coupled between a negative output node ON2 and the first common node CN21, and the gate of the second transistor T22 may receive a first input signal IN1. The second transistor T22 may change the voltage level of the negative output node ON2 by coupling the negative output node ON2 to the first common node CN21 based on the first input signal IN1. A negative output signal OUTB may be output from the negative output node ON2. The third transistor T23 may be coupled between a positive output node OP2 and the first common node CN21, and the gate of the third transistor T23 may receive a complementary signal IN1B of the first input signal IN1. The third transistor T23 may change the voltage level of the positive output node OP2 by coupling the positive output node OP2 to the first common node CN21 based on the complementary signal IN1B of the first input signal IN1. A positive output signal OUT may be output from the positive output node OP2.

The second amplifier circuit 1720 may include a fourth transistor T24, a fifth transistor T25 and a sixth transistor T26. Each of the fourth to sixth transistors T24, T25 and T26 may be an N-channel MOS transistor. The fourth transistor T24 may be coupled between a second common node CN22 and a terminal to which the ground voltage VSS is supplied, and the gate of the fourth transistor T24 may receive a complementary signal SELB of the selection signal SEL. When the complementary signal SELB of the selection signal SEL is a logic high level, the fourth transistor T24 may form a current path from the second common node CN22 to the terminal to which the ground voltage VSS is supplied. The fifth transistor T25 may be coupled between the negative output node ON2 and the second common node CN22, and the gate of the fifth transistor T25 may receive a second input signal IN2. The fifth transistor T25 may change the voltage level of the negative output node ON2 by coupling the negative output node ON2 to the second common node CN22 based on the second input signal IN2. The sixth transistor T26 may be coupled between the positive output node OP2 and the second common node CN22, and the gate of the sixth transistor T26 may receive a complementary signal IN2B of the second input signal IN2. The sixth transistor T26 may change the voltage level of the positive output node OP2 by coupling the positive output node OP2 to the second common node CN22 based on the complementary signal IN2B of the second input signal IN2.

The CML multiplexer 1700 may further include a first load resistor R21, a second load resistor R22 and a current source IS2. The first load resistor R21 may be coupled between a terminal to which the power voltage VDD is supplied and the negative output node ON2. The second load resistor R22 may be coupled between a terminal to which the power voltage VDD is supplied and the positive output node OP2. The current source IS2 may be coupled between the first transistor T21 of the first amplifier circuit 1710, the fourth transistor T24 of the second amplifier circuit 1720 and the terminal to which the ground voltage VSS is supplied. The current source IS2 may allow a constant current to flow from the first and fourth transistors T21 and T24 to the terminal to which the ground voltage VSS is supplied. The first and second amplifier circuits 1710 and 1720 of the CML multiplexer 1700 may selectively operate based on the selection signal SEL. Each of the first and second amplifier circuits 1710 and 1720 may have the same structure as the CML buffer 1600 of FIG. 16. Accordingly, the delay times of the CML buffer 1600 and the CML multiplexer 1700 may be substantially the same, and may be set to substantially half the unit delay time.

The operation of the delay line 1400 in accordance with the embodiment of the disclosure will be described below with reference to FIGS. 14 to 17. First, a coarse delay-locking operation may be performed to set the delay amount of the delay line 1400. For example, the coarse shift register 1411 may enable the enable signal EN<1>, the first selection signal SEL1<1> and the second selection signal SEL2<1> to logic high levels in a default state. The CML buffer 1511 of the first delay cell 1412-1 may delay the first and second input clock signals CLKIN and CLKINB, the first CML multiplexer 1512 may output a clock signal pair, delayed by the CML buffer 1511, as the first delayed clock signal pair FCLK and FCLKB, and the second CML multiplexer 1513 may output the clock signal pair, delayed by the CML buffer 1511, as the second delayed clock signal pair SCLK and SCLKB. The first delayed clock signal pair FCLK and FCLKB may have phases which are obtained as the first and second input clock signals CLKIN and CLKINB are delayed through two stages (that is, the CML buffer 1511 and the first CML multiplexer 1512). A delay time by the two stages may correspond to the unit delay time. The second delayed clock signal pair SCLK and SCLKB may have phases which are obtained as the first and second input clock signals CLKIN and CLKINB are delayed through two stages (that is, the CML buffer 1511 and the second CML multiplexer 1513). Therefore, the coarse delay line 1412 may output the first delayed clock signal pair FCLK and FCLKB which have the same phases as the second delayed clock signal pair SCLK and SCLKB. During the coarse delay-locking operation, the weight R<1:m> may have a preset value or a default value, and the fine delay circuit 1420 may generate the first and second output clock signals CLKOUT and CLKOUTB by mixing the phases of the first and second delayed clock signal pairs FCLK, FCLKB, SCLK and SCLKB output from the coarse delay circuit 1410, based on the weight R<1:m>. The fine delay circuit 1420 may generate the shifted clock signal pair SSCLK and SSCLKB by additionally delaying the second delayed clock signal pair SCLK and SCLKB through one stage (that is, the CML buffer 1422-1). Therefore, the shifted clock signal pair SSCLK and SSCLKB may have phases which are obtained as the first and second input clock signals CLKIN and CLKINB are delayed through three stages, and may have a phase difference corresponding to one stage from the first delayed clock signal pair FCLK and FCLKB (that is, a phase difference corresponding to substantially half the unit delay time).

If the coarse increase signal INCC of the coarse control signal DCC is enabled, the coarse shift register 1411 may maintain enable states of the enable signal EN<1> and the second selection signal SEL2<1>, may disable the first selection signal SEL1<1> to a logic low level, and may enable the enable signal EN<2> and the first selection signal SEL1<2> to logic high levels. The CML buffer 1521 of the second delay cell 1412-2 may receive a clock signal pair delayed by the CML buffer 1511 of the first delay cell 1412-1, and may delay the received clock signal pair. The first CML multiplexer 1522 of the second delay cell 1412-2 may output a clock signal pair, delayed by the CML buffer 1521, to the first CML multiplexer 1512 of the first delay cell 1412-1, and the first CML multiplexer 1512 of the first delay cell 1412-1 may output the clock signal pair, output from the first CML multiplexer 1522 of the second delay cell 1412-2, as the first delayed clock signal pair FCLK and FCLKB. The second CML multiplexer 1513 of the first delay cell 1412-1 may output the clock signal pair, delayed by the CML buffer 1511, as the second delayed clock signal pair SCLK and SCLKB. The first delayed clock signal pair FCLK and FCLKB may have phases which are obtained as the first and second input clock signals CLKIN and CLKINB are delayed through four stages (that is, the CML buffer 1511 of the first delay cell 1412-1, the CML buffer 1521 of the second delay cell 1412-2, the first CML multiplexer 1522 of the second delay cell 1412-2 and the first CML multiplexer 1512 of the first delay cell 1412-1). The second delayed clock signal pair SCLK and SCLKB may have phases which are obtained as the first and second input clock signals CLKIN and CLKINB are delayed through two stages. The shifted clock signal pair SSCLK and SSCLKB may have phases which are obtained as the first and second input clock signals CLKIN and CLKINB are delayed through three stages, and the first delayed clock signal pair FCLK and FCLKB and the shifted clock signal pair SSCLK and SSCLKB may have a phase difference corresponding to one stage. The shifted clock signal pair SSCLK and SSCLKB may have phases which lead the first delayed clock signal pair FCLK and FCLKB by a phase corresponding to substantially half the unit delay time.

If the coarse increase signal INCC of the coarse control signal DCC is enabled again, the coarse shift register 1411 may maintain enable states of the enable signal EN<1>, the enable signal EN<2> and the first selection signal SEL1<2>, may disable the second selection signal SEL2<1> to a logic low level, and may enable the second selection signal SEL2<2> to a logic high level. The first CML multiplexer 1522 of the second delay cell 1412-2 may output a clock signal pair, delayed by the CML buffer 1521, to the first CML multiplexer 1512 of the first delay cell 1412-1, and the first CML multiplexer 1512 of the first delay cell 1412-1 may output the clock signal pair, output from the first CML multiplexer 1522 of the second delay cell 1412-2, as the first delayed clock signal pair FCLK and FCLKB. The second CML multiplexer 1523 of the second delay cell 1412-2 may output a clock signal pair, delayed by the CML buffer 1521 of the second delay cell 1412-2, to the second CML multiplexer 1513 of the first delay cell 1412-1, and the second CML multiplexer 1513 of the first delay cell 1412-1 may output the clock signal pair, output from the second CML multiplexer 1523 of the second delay cell 1412-2, as the second delayed clock signal pair SCLK and SCLKB. The first delayed clock signal pair FCLK and FCLKB may have phases which are obtained as the first and second input clock signals CLKIN and CLKINB are delayed through four stages. The second delayed clock signal pair SCLK and SCLKB may have phases which are obtained as the first and second input clock signals CLKIN and CLKINB are delayed through four stages (that is, the CML buffer 1511 of the first delay cell 1412-1, the CML buffer 1521 of the second delay cell 1412-2, the second CML multiplexer 1523 of the second delay cell 1412-2 and the second CML multiplexer 1513 of the first delay cell 1412-1). The shifted clock signal pair SSCLK and SSCLKB may have phases which are obtained as the first and second input clock signals CLKIN and CLKINB are delayed through five stages, and the first delayed clock signal pair FCLK and FCLKB and the shifted clock signal pair SSCLK and SSCLKB may have phase differences corresponding to one stage. The first delayed clock signal pair FCLK and FCLKB may have phases which lead the shifted clock signal pair SSCLK and SSCLKB by a phase corresponding to substantially half the unit delay time.

When the coarse delay-locking operation is completed, the fine delay-locking operation may be performed. When the fine delay-locking operation is performed, the logic value of the weight R<1:m> may be changed by the fine control signal DCF. When the logic value of the weight R<1:m> is changed in a stepwise manner, the phase mixing circuit 1422 may change the phases of the first and second output clock signals CLKOUT and CLKOUTB by 1/m of a phase corresponding to one stage. The weight R<1:m> may be changed like a thermometer code. If the weight R<1:m> reaches a minimum value or a maximum value, one of the coarse increase signal INCC and the coarse decrease signal DECC of the coarse control signal DCC may be enabled, and the weight R<1:m> may be increase from the minimum value or be decreased from the maximum value. For example, it is assumed that the phases of the first and second delayed clock signal pairs FCLK, FCLKB, SCLK and SCLKB are set to be the same during the coarse delay-locking operation. When the phases of the first and second output clock signals CLKOUT and CLKOUTB lead the phases of target clock signals during the fine delay-locking operation, the fine increase signal INCF may be enabled. The fine shift register 1421 may continuously increase the logic value of the weight R<1:m> each time the fine increase signal INCF is enabled. As the logic value of the weight R<1:m> increases, the first and second output clock signals CLKOUT and CLKOUTB may have phases which are close to the phases of the shifted clock signal pair SSCLK and SSCLKB. In the case where the weight R<1:m> reaches the maximum value and the first and second output clock signals CLKOUT and CLKOUTB still have phases which lead the phases of the target clock signals, the coarse increase signal INCC may be enabled, and the first delayed clock signal pair FCLK and FCLKB which has phases lagging behind the second delayed clock signal pair SCLK and SCLKB by the unit delay time may be generated from the coarse delay circuit 1410. Since the weight R<1:m> is the maximum value, the first and second output clock signals CLKOUT and CLKOUTB may still have phases which are close to the phases of the shifted clock signal pair SSCLK and SSCLKB. When the fine increase signal INCF is continuously enabled, the logic value of the weight R<1:m> may be decreased from the maximum value in a stepwise manner. As the logic value of the weight R<1:m> is decreased, the phases of first and second output clock signals CLKOUT and CLKOUTB may be close to the first delayed clock signal pair FCLK and FCLKB, and may lag by 1/16 of the unit delay time. Therefore, even when the coarse delay circuit 1410 changes the phases of the first and second delayed clock signal pairs FCLK, FCLKB, SCLK and SCLKB by a phase corresponding to the unit delay time during the coarse delay-locking operation, the fine delay circuit 1420 may change the phases of the first and second output clock signals CLKOUT and CLKOUTB by a phase corresponding to substantially half the unit delay time. In addition, because the fine delay circuit 1420 may change the phases of the first and second output clock signals CLKOUT and CLKOUTB by 1/16 of the unit delay time in a stepwise manner during the fine delay-locking operation, the fine delay circuit 1420 may perform a seamless phase mixing operation and have a high resolution.

Those skilled in the art to which this disclosure pertains should understand that the embodiments are only illustrative from all aspects not being limitative because this disclosure may be implemented in various other forms without departing from the technical spirit or essential characteristics of this disclosure. Accordingly, the scope of this disclosure is defined by the appended claims rather than by the detailed description, and all modifications or variations derived from the meanings and scope of the claims and equivalents thereof should be understood as being included in the scope of this disclosure.

What is claimed is:
1. A clock generation circuit comprising:
a clock receiver configured to receive a first clock signal and a second clock signal to generate a first reception clock signal and a second reception clock signal;
a first delay loop circuit configured to receive the first reception clock signal and the second reception clock signal to generate a reference clock signal and to perform a delay-locking operation on the reference clock signal to generate a first delay locked clock signal; and
a second delay loop circuit configured to delay the first reception clock signal and the second reception clock signal based on the first delay locked clock signal and a first internal clock signal to generate the first internal clock signal.

2. The clock generation circuit of claim 1, wherein the first delay loop circuit is configured to activate the second delay loop circuit based on an operation mode and the delay-locked operation.

3. The clock generation circuit of claim 2,
wherein the first delay loop circuit generates an enable signal based on the operation mode and the delay-locked operation, and
wherein the second delay loop circuit is deactivated in response to receiving the enable signal having a disabled state and is activated in response to receiving the enable signal having an enabled state.

4. The clock generation circuit of claim 1, wherein the first delay loop circuit is configured to activate the second delay loop circuit based on a phase of the first delay locked clock signal.

5. The clock generation circuit of claim 1, wherein the first delay loop circuit is configured to deactivate the second delay loop circuit when a phase of the first delay locked clock signal is changed within a given range in a power-down mode.

6. The clock generation circuit of claim 1, wherein the first delay loop circuit comprises:
a first clock buffer configured to buffer the first and second reception clock signals and provide the buffered clock signal as the reference clock signal;
a first clock delay line configured to delay the reference clock signal based on a first delay control signal to generate the first delay locked clock signal;
a replica configured to delay the first delay locked clock signal by a modeled delay time to generate a feedback clock signal;
a first phase detector configured to compare phases of the reference clock signal and feedback clock signal to generate a first phase detection signal; and
a first delay control circuit configured to generate the first delay control signal based on the first phase detection signal.

7. The clock generation circuit of claim 6, wherein the first delay loop circuit further comprises a clock divider configured to divide a frequency of the buffered clock signal to generate the reference clock signal.

8. The clock generation circuit of claim 6, wherein the first delay loop circuit further comprises an enable control circuit configured to generate an enable signal to activate the second delay loop circuit based on a power-down signal and the first delay control signal.

9. The clock generation circuit of claim 7,
wherein the second delay control signal includes a coarse control signal and a fine control signal, and
wherein the second clock delay line comprises:
a coarse delay circuit configured to generate a first delayed clock signal pair and a second delayed clock signal pair by delaying the first and second reception clock signals based on the coarse control signal, the first delayed clock signal pair having phases the same as or lagging behind the second delayed clock signal pair by a unit delay time; and a fine delay circuit configured to generate a shifted clock signal pair by delaying the second delayed clock signal pair by a phase corresponding to substantially half the unit delay time, and generate the second delay-locked clock signal and the complementary second delay-locked clock signal by mixing phases of the first delayed clock signal pair and the shifted clock signal pair based on the fine control signal.

10. The clock generation circuit of claim 8,
wherein the first delay control signal comprises a phase increase signal and a phase decrease signal, and
wherein the enable control circuit is configured to maintain a state of the enable signal to a disable state when one of the phase increase signal and phase decrease signal is not continuously generated by a number of times corresponding to a threshold value and to enable the enable signal when one of the phase increase signal and phase decrease signal is continuously generated by the number of times corresponding to the threshold value, when the power-down signal is enabled.

11. The clock generation circuit of claim 1, wherein the second delay loop circuit comprises:
a second clock delay line configured to delay the first reception clock signal and the second reception clock signal based on a second delay control signal to generate a second delay locked clock signal and a complementary second delay locked clock signal;
a clock division circuit configured to divide frequencies of the second delay locked clock signal and complementary second delay locked clock signal to generate the first internal clock signal;
a second phase detector configured to compare phases of the first internal clock signal and first delay locked clock signal to generate a second phase detection signal; and
a second delay control circuit configured to generate the second delay control signal based on the second phase detection signal.

12. The clock generation circuit of claim 11, wherein the second clock delay line comprises a plurality of current mode logic (CML) delay cells configured to sequentially delay the first and second reception clock signals based on the second delay control signal.

13. The clock generation circuit of claim 11, wherein the clock division circuit comprises:
a current mode logic (CML) clock divider configured to divide the frequencies of the second delay locked clock signal and complementary second delay locked clock signal to generate a plurality of division clock signals; and
a CML to complementary metal-oxide-semiconductor (CMOS) converter configured to generate the first internal clock signal based on at least two of the plurality of division clock signals.

14. The clock generation circuit of claim 13, wherein:
the CML clock divider is configured to generate a first division clock signal, a second division clock signal, a third division clock signal, and a fourth division clock signal each sequentially having a phase difference of 90 degrees, and
the CML to CMOS converter is configured to generate the first internal clock signal and a third internal clock signal based on the first and third division clock signals and generate a second internal clock signal and a fourth internal clock signal based on the second and fourth division clock signals.

15. The clock generation circuit of claim 14,
wherein the second delay loop circuit further comprises a dummy circuit coupled to nodes from which the second internal clock signal, the third internal clock signal, and the fourth internal clock signal are output, and
wherein the dummy circuit models the second phase detector.

16. The clock generation circuit of claim 11, wherein the second delay loop circuit further comprises a second clock buffer configured to buffer the first and second reception clock signals and provide the buffered clock signals to the second clock delay line.

17. The clock generation circuit of claim 11, wherein the second delay loop circuit further comprises a duty cycle corrector configured to correcting duty cycles of clock signals output by the second clock delay line to generate the second delay locked clock signal and the complementary second clock signal.

18. A clock generation circuit comprising:
a clock receiver configured to receive a first clock signal and a second clock signal to generate a first reception clock signal and a second reception clock signal;
a first delay loop circuit configured to receive the first and second reception clock signals to generate a first reference clock signal and to delay the first reference clock signal based on the first delay locked clock signal and a first internal clock signal to generate a first delay locked clock signal; and
a second delay loop circuit configured to perform delay-locking operations on the first and second reception clock signals to generate the first internal clock signal.

19. The clock generation circuit of claim 18, wherein the first delay loop circuit comprises:
a first clock buffer configured to buffer the first and second reception clock signals and provide the buffered clock signal as the first reference clock signal;
a first clock delay line configured to delay the first reference clock signal based on a first delay control signal to generate the first delay locked clock signal;
a first phase detector configured to compare phases of the first delay locked clock signal and the first internal clock signal to generate a first phase detection signal; and
a first delay control circuit configured to generate the first delay control signal based on the first phase detection signal.

20. The clock generation circuit of claim 19, wherein the first delay loop circuit further comprises a first clock divider configured to divide a frequency of the buffered clock signal to generate the first reference clock signal.

21. The clock generation circuit of claim 18, wherein the second delay loop circuit comprises:
a second clock delay line configured to delay the first reception clock signal and the second reception clock signal based on a second delay control signal to generate a second delay locked clock signal and a complementary second delay locked clock signal;
a clock division circuit configured to divide frequencies of the second delay locked clock signal and complementary second delay locked clock signal to generate the first internal clock signal;
a replica configured to delay the first internal clock signal by a modeled delay time to generate a feedback clock signal;

a second phase detector configured to compare phases of the feedback clock signal and a second reference clock signal which generated from the first reception clock signal and the second reception clock signal to generate a second phase detection signal; and a second delay control circuit configured to generate the second delay control signal based on the second phase detection signal.

22. The clock generation circuit of claim 21,
wherein the second delay control signal includes a coarse control signal and a fine control signal, and
wherein the second clock delay line comprises:
a coarse delay circuit configured to generate a first delayed clock signal pair and a second delayed clock signal pair by delaying the first and second reception clock signals based on the coarse control signal, the first delayed clock signal pair having phases the same as or lagging behind the second delayed clock signal pair by a unit delay time; and
a fine delay circuit configured to generate a shifted clock signal pair by delaying the second delayed clock signal pair by a phase corresponding to substantially half the unit delay time, and generate the second delay-locked clock signal and the complementary second delay-locked clock signal by mixing phases of the first delayed clock signal pair and the shifted clock signal pair based on the fine control signal.

23. The clock generation circuit of claim 21, wherein the second clock delay line comprises a plurality of current mode logic (CML) delay cells configured to sequentially delay the first and second reception clock signals based on the second delay control signal.

24. The clock generation circuit of claim 21, wherein the clock division circuit comprises:
a current mode logic (CML) clock divider configured to divide the frequencies of the second delay locked clock signal and complementary second delay locked clock signal to generate a plurality of division clock signals; and
a CML to complementary metal-oxide-semiconductor (CMOS) converter configured to generate the first internal clock signal based on at least two of the plurality of division clock signals.

25. The clock generation circuit of claim 24, wherein:
the CML clock divider is configured to generate a first division clock signal, a second division clock signal, a third division clock signal, and a fourth division clock signal each sequentially having a phase difference of 90 degrees, and
the CML to CMOS converter is configured to generate the first internal clock signal and a third internal clock signal based on the first and third division clock signals and generate a second internal clock signal and a fourth internal clock signal based on the second and fourth division clock signals.

26. The clock generation circuit of claim 25, wherein:
the second delay loop circuit further comprises a dummy circuit coupled to nodes from which the second internal clock signal, the third internal clock signal, and the fourth internal clock signal are output, and
the dummy circuit models the second phase detector.

27. The clock generation circuit of claim 21, wherein the second delay loop circuit further comprises a second clock buffer configured to buffer the first and second reception clock signals and provide the buffered clock signals to the second clock delay line.

28. The clock generation circuit of claim 21, wherein the second delay loop circuit further comprises:
a third clock buffer configured to buffer the first and second reception clock signals to generate a buffered clock signal; and
a second clock divider configured to divide a frequency of the buffered clock signal to generate the second reference clock signal.

29. The clock generation circuit of claim 21, wherein the second delay loop circuit further comprises a duty cycle corrector configured to correct duty cycles of clock signals output by the second clock delay line to generate the second delay locked clock signal and the complementary second clock signal.

30. A semiconductor device comprising:
a clock receiver configured to receive a first clock signal and a second clock signal to generate a first reception clock signal and a second reception clock signal;
a first delay loop circuit comprising a single-ended complementary metal-oxide-semiconductor (CMOS) clock delay line and configured to delay a reference clock signal which is generated from the first and second reception clock signals based on the reference clock signal and a first delay locked clock signal to generate the first delay locked clock signal;
a second delay loop circuit comprising a differential current mode logic (CML) clock delay line and configured to delay the first and second reception clock signals based on the first delay locked clock signal and the first internal clock signal to generate a first internal clock signal;
a command decoder configured to decode a command signal to generate an internal command signal;
a command delay line configured to delay the internal command signal with as much time as what is substantially identical with a time duration needed for the reference clock signal to be delayed through the single-ended CMOS clock delay line to generate a delay command signal;
a latency shifting circuit configured to delay the delay command signal with as much time as what corresponds to a latency based on the first delay locked clock signal to generate a synchronization command signal; and
a gating circuit configured to synchronize the synchronization command signal with the first internal clock signal to generate an output control signal.

31. A semiconductor device comprising:
a clock receiver configured to receive a first clock signal and a second clock signal to generate a first reception clock signal and a second reception clock signal;
a first delay loop circuit comprising a single-ended complementary metal-oxide-semiconductor (CMOS) clock delay line and configured to delay a first reference clock signal which is generated from the first and second reception clock signals based on the first reference clock signal and a first internal clock signal to generate a first delay locked clock signal;
a second delay loop circuit comprising a differential current mode logic (CML) clock delay line and configured to delay the first and second reception clock signals based on the first internal clock signal and a second reference clock signal generated from the first and second reception clock signals to generate the first internal clock signal;
a command decoder configured to decode a command signal to generate an internal command signal;

a command delay line configured to delay the internal command signal for as much as a time duration substantially identical to a time duration needed for the first reference clock signal to be delayed through the single-ended CMOS clock delay line to generate a delay command signal;
a latency shifting circuit configured to delay the delay command signal with as much time as what corresponds to a latency based on the first internal clock signal to generate a synchronization command signal; and
a gating circuit configured to synchronize the synchronization command signal with the first internal clock signal to generate an output control signal.

* * * * *